US006724651B2

(12) United States Patent
Hirai

(10) Patent No.: US 6,724,651 B2
(45) Date of Patent: Apr. 20, 2004

(54) NONVOLATILE SOLID-STATE MEMORY AND METHOD OF DRIVING THE SAME

(75) Inventor: Tadahiko Hirai, Kanagawa (JP)

(73) Assignee: Canon Kabushiki Kaisha, Tokyo (JP)

(*) Notice: Subject to any disclaimer, the term of this patent is extended or adjusted under 35 U.S.C. 154(b) by 88 days.

(21) Appl. No.: 10/112,722

(22) Filed: Apr. 2, 2002

(65) Prior Publication Data

US 2002/0145905 A1 Oct. 10, 2002

(30) Foreign Application Priority Data

Apr. 6, 2001 (JP) .......................................... 2001-108591
May 2, 2001 (JP) .......................................... 2001-135032

(51) Int. Cl.$^7$ ............................................. G11C 11/00
(52) U.S. Cl. ............................ 365/158; 365/171; 365/173
(58) Field of Search ............................ 365/158, 171, 365/173

(56) References Cited

U.S. PATENT DOCUMENTS

| | | | |
|---|---|---|---|
| 6,515,896 B1 * | 2/2003 | Tran ............................ | 365/171 |
| 6,522,573 B2 * | 2/2003 | Saito et al. .................. | 365/158 |
| 2001/0038548 A1 * | 11/2001 | Perner et al. ................. | 365/66 |

OTHER PUBLICATIONS

R.E. Scheuerlein, "Magneto–Resistive IC Memory Limitations and Architecture Implications", Proc. Of Int'l NonValatile Memory Technology Conference., 1998, pp. 47–50.

* cited by examiner

Primary Examiner—Huan Hoang

(57) ABSTRACT

The present invention is aimed at decreasing the current required for writing in a magnetic random access memory (MRAM), and power consumption thereof. In a magnetic random access memory of the present invention, information is written in memory elements arranged in a same row or column by performing once each of the first information writing step of applying a first magnetic field to put memory elements in the high-resistance state, and the second information writing step of applying a second magnetic field to the memory elements in which the first information has not been written to write information in all memory elements in the same row under recording of information. Alternatively, a magnetic random access memory includes a plurality of first wirings for applying a magnetic field in the direction of the easy magnetization axis of a magnetic layer, and a plurality of second wirings for applying a magnetic field in a direction inclined from the direction of the easy magnetization axis of the magnetic layer, wherein a current is passed through one of the second wirings to apply a magnetic field to all memory elements arranged in a same row or column of the rows or columns of a plurality of the memory cells arranged in parallel to the second wirings, and currents are passed through the plurality of first wirings in directions according to the information to be recorded in the respective memory elements synchronously with the current pulse passed through the second wiring to apply a magnetic field to each of the magnetoresistive elements, thereby recording information on the plurality of memory elements arranged in the same row or column.

19 Claims, 29 Drawing Sheets

(a)   (b)

(a)   (b)

NONVOLATILE SOLID-STATE MEMORY AND METHOD OF DRIVING THE SAME

BACKGROUND OF THE INVENTION

1. Field of the Invention

The present invention relates to a memory for storing information, and particularly to a nonvolatile memory using a magnetic material, and a method of driving the same.

2. Description of the Related Art

Magnetic materials such as ferromagnetic materials and ferrimagnetic materials have the property that magnetization produced in a magnetic material by an external magnetic field remains after the external magnetic field is removed. The magnetization remaining in the magnetic material is referred to as "residual magnetization". Also, the electric resistance of a magnetic material changes with the direction of magnetization and the presence of magnetization. This is referred to as a "magnetoresistance effect", and the rate of change in the electric resistance value is referred to as a "magnetoresistance ratio (MR ratio)". Materials having a high magnetoresistance ratio include giant magnetoresistance (GMR) materials, colossal magnetoresistance (CMR) materials, and the like. These materials include metals, alloys, compound oxides, and the like. Examples of these materials include transition metals and rare earth metals such as Fe, Ni, Co, Gd, Tb, and the like; alloys thereof; compound oxides such as $La_xSr_{1-x}MnO_9$, $La_xCa_{1-x}MnO_9$, and the like.

By selecting the electric resistance value according to the direction and presence of residual magnetization of a magnetoresistance material, a nonvolatile memory for storing information as an electric resistance value can be formed. Such a nonvolatile memory is referred to as "MRAM" (Magnetic Random Access Memory).

Many MRAMs, which have recently been in progress of development, have a structure in which a magnetoresistive element comprising a nonmagnetic layer sandwiched between magnetic layers is used as a memory element. The MRAMs also use a system in which a change in electric resistance produced by a difference between the magnetization directions of both magnetic layers is converted to a voltage to read stored information. Also, the magnetization direction of a memory cell is changed by a magnetic field induced by passing a current through a write line to permit writing or rewriting of information.

The cell structure and driving method of an MRAM are disclosed in, for example, R. E. Scheuerlein (1998, Proc. of Int. Nonvolatile Memory Conf., P47). In this publication, a memory (matrix type) comprising memory cells each comprising a giant magnetoresistive thin film and a pair of crossed write lines and a pair of crossed readout lines or a pair of crossed wirings used as a write line and a readout line, and a diode connected to the memory cell in series is proposed.

The conventional MRAMs use a common method in which when information is written in a selected cell of the cells arranged in a matrix, a current pulse is applied to write wiring connected to the selected cell or adjacent thereto to apply a magnetic field in the direction of easy magnetization of a memory element, changing the magnetization direction of the selected cell.

Furthermore, each time information is written in a selected memory cell, write currents are passed through both the corresponding write line and wiring for producing a memory cell selecting assist magnetic field. Since a pulse is applied to wiring once for writing in each element, a current of several mA to several tens mA is possibly required as a write current. This is a main cause of a significant increase in the power consumption of a conventional MRAM. For example, as disclosed in 2000, Proc. of Int. Solid-State Circuits Conf., P128, a 2T2R-model MRAM chip proposed by IBM requires a current of 16 mA for rewriting information in each cell. As the condition for operating the MRAM chip, a power consumption of 640 mW is required only for passing a write current on the assumption that 32-bit parallel writing is driven by a supply voltage of 2.5 V.

In various technical fields, there has recently been a tendency to decrease the weight, size and power consumption of a memory. Particularly, MRAMs expected to be mounted on various electronic apparatuses have a large problem of power consumption. Particularly, in mounting the MRAM on a mobile apparatus or the like, which is strongly demanded to decrease power consumption, a large write current is a serious problem.

SUMMARY OF THE INVENTION

The present invention has been achieved for solving the problem of the conventional technique, and an object of the present invention is to provide a magnetic memory which can be operated with low power consumption, and a method of driving the same.

In order to achieve the object, in an aspect of the present invention, an MRAM comprises a plurality of memory elements arranged in a matrix so that the electric resistance of each of the memory elements can be switched to a high-resistance state and a low-resistance state by selecting the magnetization direction of a magnetic layer; a plurality of bit lines arranged for the respective rows of the matrix, and a plurality of write lines arranged for the respective columns of the matrix so as to cross the bit lines, ends of the memory elements being connected to any one of the bit lines; wherein information is written in the memory elements arranged in a same row or column by performing once each of the first information writing step of applying a first magnetic field to put the memory elements in the high-resistance state, and the second information writing step of applying a second magnetic field to the memory elements in which the first information has not been written, to write information in all memory elements in the same column under recording of information.

In another aspect of the present invention, an MRAM comprises a plurality of memory cells each comprising a magnetoresistive element as a memory element having a structure in which a nonmagnetic layer is sandwiched by magnetic layers; a plurality of first wirings for applying a magnetic field in the direction of easy magnetization of the magnetic layers; and a plurality of second wirings for applying a magnetic field in a direction inclined from the direction of easy magnetization of the magnetic layers, the memory cells being arranged in a matrix; wherein a current is passed through one of the second wirings to apply a magnetic field to all memory elements arranged in a same row or column of the rows or columns of a plurality of memory cells arranged in parallel with the second wirings, and a current is passed through each of the plurality of first wirings in a direction according to the information to be recorded in each of the memory elements synchronously with the current pulse passed through the second wiring to apply a magnetic field to each of the magnetoresistive elements, thereby recording information on the plurality of memory elements arranged in a same row or column.

Further objects, features and advantages of the present invention will become apparent from the following description of the preferred embodiments with reference to the attached drawings.

DESCRIPTION OF THE PREFERRED EMBODIMENTS

Figure 1:
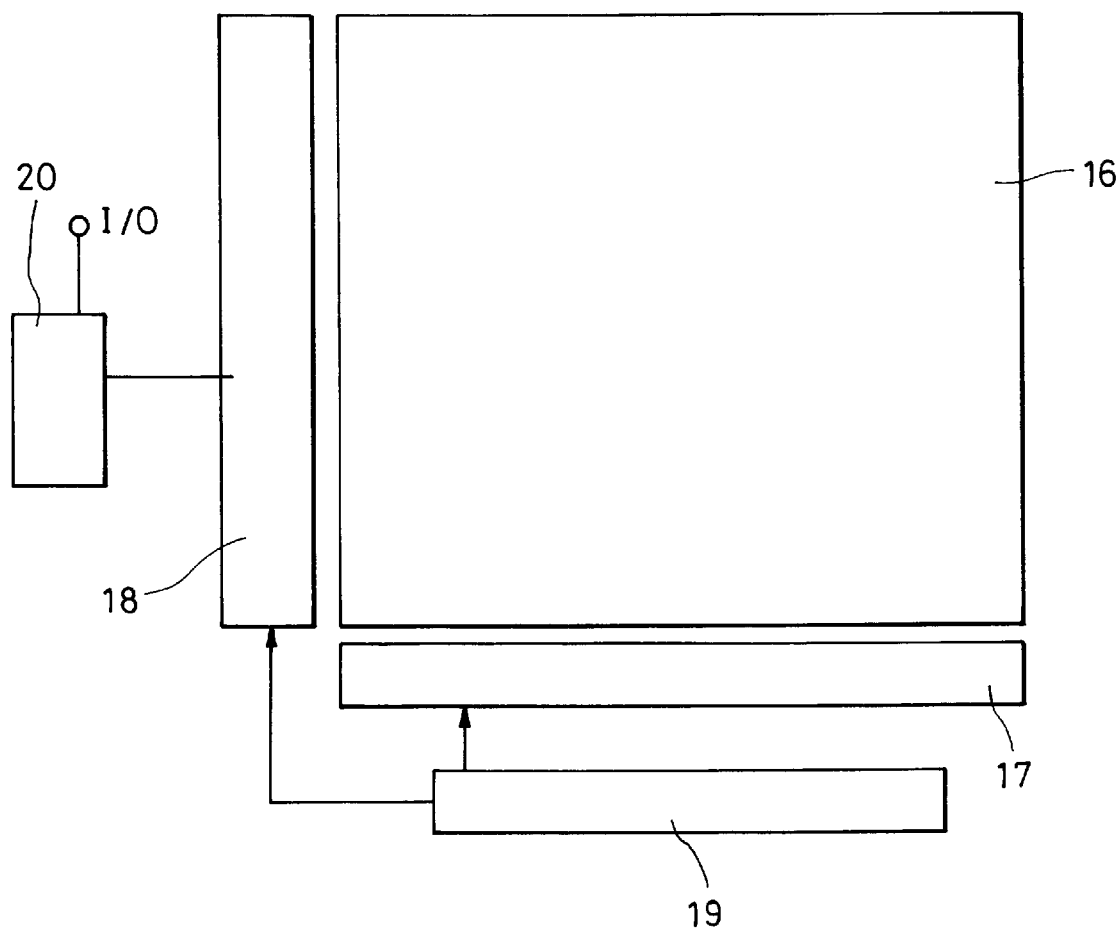
FIG. 1 is a drawing showing the configuration of an MRAM of the present invention.

In an MRAM of the present invention, information is written, in parallel, in a plurality of memory elements arranged in parallel near a wiring instead of applying a pulse once to each of wiring for applying a magnetic field in the direction of easy magnetization and wiring for an assist magnetic field at the time of writing in each of the memory elements. Namely, information is written, in parallel, in all memory elements in each row or column under recording.

For example, write lines are arranged to produce a magnetic field in the direction of the easy magnetization axis of a recording layer of each of the memory elements so that the recording layers are respectively magnetized in the directions of the magnetic fields produced by the writing lines to record information. When a forward current flows through write wiring, information "1" (parallel magnetization as FIG. 3A(b) or FIG. 3B(b)) is written, while when a reverse current flows, information "0" (antiparallel magnetization as FIG. 3A(a) or FIG. 3B(a)) is written. Bit lines for reading out information are arranged to produce magnetic fields inclined from the easy magnetization easy axis of the recording layers, for example, perpendicular to the easy magnetization easy. The memory cells arranged in a row (or a column) under recording of information generally include memory cells in which "1" should be written, and memory cells in which "0" should be written. Therefore, when a forward current is passed through the same write line, currents are passed through the bit lines corresponding to the memory cells in which "1" should be written. In the reverse case, currents are passed through the bit lines corresponding to the memory cells in which "0" should be written. Namely, pulses with different polarities are applied twice to the same write line, and current pulses are applied twice to the bit lines synchronously with pulse application to the write line to record information on all memory elements in the same row or column under recording of information.

Another embodiment comprises assist magnetic field wiring for applying a magnetic field to each of the memory elements in a direction different from the easy magnetization axis, and magnetic field producing wiring for applying a magnetic field in the direction of the easy magnetization axis to determine the magnetization direction. In this embodiment, current pulses corresponding to "1" or "0" are synchronously applied by the wiring for determining the magnetization direction, and at the same time, the assist magnetic field is applied to all memory elements in the same row or column of the rows or columns of the memory elements arranged in parallel to the assist wiring. As a result, information is recorded on all memory elements in the same row or column under recording. Namely, in this MRAM, by applying the assist magnetic field only once, information can be recorded on all memory elements in the same row or column under recording. In this case, either of both wirings may be used for bit lines. When the wiring for determining the magnetization direction is used for the bit lines, a power supply for passing a current in both directions may be provided. However, when information written in parallel in a plurality of memory elements is read out in parallel, the readout speed and the read-out efficiency are improved. Therefore, the wiring for determining the magnetization direction is preferably used for the bit lines in order to write information in parallel in the memory element group arranged in each of columns crossing the bit lines.

FIG. 1 is a block diagram of a memory. In FIG. 1, reference numeral 16 denotes a memory array comprising a plurality of memory elements arranged in a matrix; reference numeral 17, a row driver; reference numeral 18, a column driver; reference numeral 19, an address control circuit for inputting an address signal to each of the row driver and the column driver; reference numeral 20, an input/output data control circuit for controlling input data and amplifying read signals. In this block configuration, timing of application of current pulses to write lines and bit lines, and writing and reading of polarity information are appropriately performed.

These operations can be appropriately performed by selecting the direction of the easy magnetization axis of a magnetic film, the arrangement of memory cells, and the like.

Embodiments of the present invention will be described in further detail below with reference to the drawings.

First Embodiment

Figure 2:
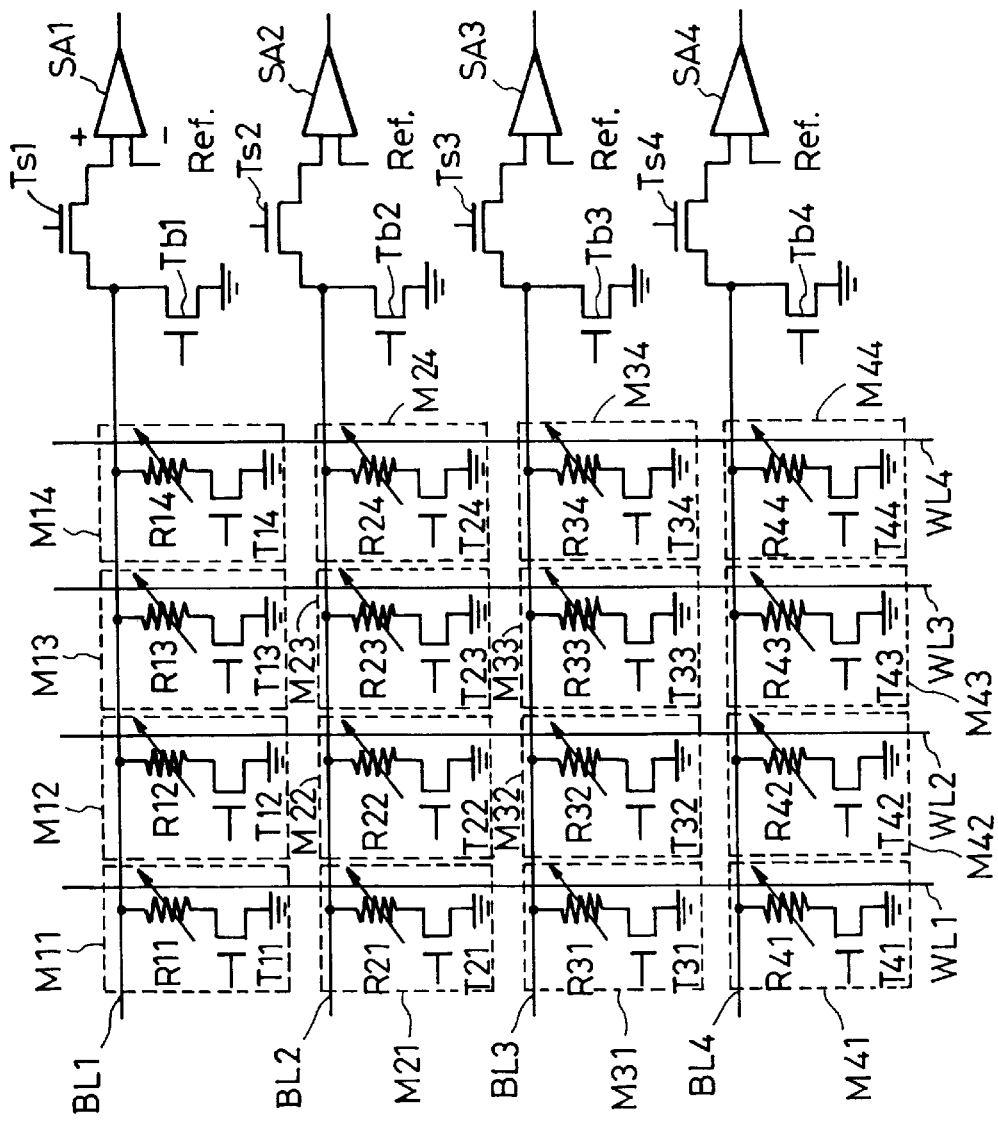
FIG. 2 is a drawing showing the circuit configuration of an MRAM according to a first embodiment.

FIG. 2 is a drawing showing the circuit configuration of a memory array of an MRAM of this embodiment. The configuration comprises memory element selecting field effect transistors (FET) T11 to T14, T21 to T24, T31 to T34, and T41 to T44; memory elements R11 to R14, R21 to R24, R31 to R34, and R41 to R44; bit lines BL1 to BL4; write lines WL1 to WL4; field effect transistors Ts1 to Ts4; field effect transistors Tb1 to Tb4; and sense amplifiers SA1 to SA4. As the memory elements, any elements may be used as long as magnetoresistance is exhibited. For examples, GMR elements, CMR elements, and the like may be used. Of these elements, tunnel magnetoresistance (MTJ: Magnetic Tunnel Junction, TMR: Tunnel Magneto-Resistance) elements are preferably used, in which a tunnel insulating film is sandwiched between two magnetic layers. The tunnel magnetoresistance elements can increase the magnetoresistance ratio (MR ratio), and can thus be preferably used as the memory elements of the MRAM.

The bit lines BL1 to BL4 are arranged in parallel to each other. The write lines WL1 to WL4 are arranged in parallel to each other so as to cross the bit lines BL1 to BL4.

The memory element selecting field effect transistors T11 to T44 are paired with the corresponding TMR elements to constitute the memory cells M11 to M44, respectively. The sixteen memory cells M11 to M44 are respectively arranged near the intersections of the bit lines BL1 to BL4 and the write lines WL1 to WL4 to form a 4×4 matrix.

One terminal of each of the TMR elements is connected to a drain of the corresponding memory element selecting FET, a source of the FET being grounded. The other terminals of the TMR elements are connected to the bit lines. For example, when one of the field effect transistors T11, T12, T13 and T14 connected to the bit line BL1 is turned on, a current flows through the bit line BL1 through the corresponding TMR element, and the bit line BL1 is at a predetermined voltage corresponding to the electric resistance value of the TMR element.

The drains of the field effect transistors Tb1, Tb2, Tb3 and Tb4 are respectively connected to the corresponding bit lines, the sources being grounded. Namely, the field effect transistors Tb1 to Tb4 are switching elements for respectively grounding the corresponding bit lines.

The drains of the field effect transistors Ts1, Ts2, Ts3 and Ts4 are connected to the corresponding bit lines, and the sources are respectively connected to input terminals of the corresponding sense amplifiers SA1, SA2, SA3 and SA4. The field effect transistors Ts1, Ts2, Ts3 and Ts4 are switching elements for inputting the voltages of the bit lines to the corresponding sense amplifiers when being turned on.

A reference voltage Ref. is applied to the other input terminals of the sense amplifiers SA. Each of the sense amplifiers is a signal detection circuit for outputting information "1" or "0" based on the result of comparison between the voltage levels applied to both input terminals. In this embodiment, each of the sense amplifiers compares the voltage of the corresponding bit line and the reference voltage Ref.

FIG. 3 is a schematic drawing showing the structure of the memory element of this embodiment. In general, when an external magnetic field H is applied in the direction of the easy magnetization axis, a magnetic material such as a ferromagnetic material, a ferrimagnetic material, or the like produces polarization (i.e., magnetization) in the inside to show such a hysteresis characteristic as shown in FIG. 4. The external magnetic field at the time of reversal of magnetization, i.e., the external magnetic field at the crossing point of the MH curve and the H axis shown in FIG. 4, is referred to as "coercive force Hc".

When an external magnetic field in the direction of the easy magnetization axis and an external magnetic field in a direction different from the easy magnetization axis are applied, the coercive force Hc of a magnetic material becomes lower than the case of application of one magnetic field. Namely, when an external magnetic field lower than the coercive force Hc initially possessed by a magnetic material is applied in the direction of the easy magnetization axis, magnetization is reversed. The MRAM employs this characteristic so that magnetic fields in at least two directions are applied only to specified memory elements to selectively record information.

In FIG. 3, two magnetic layers 16 have different coercive forces. Namely, the two magnetic layers 16 include a hard layer having high coercive force and a soft layer having low coercive force. Either of the hard and soft layers may be used as a recording layer. The electric resistance value of the memory element in which the hard and soft layers have parallel magnetization directions is different from the case in which the hard and soft layers have antiparallel magnetization directions. This phenomenon is a type of magnetoresistance, and a variation in the electric resistance value is 40% or more in some cases.

Figure 3A:
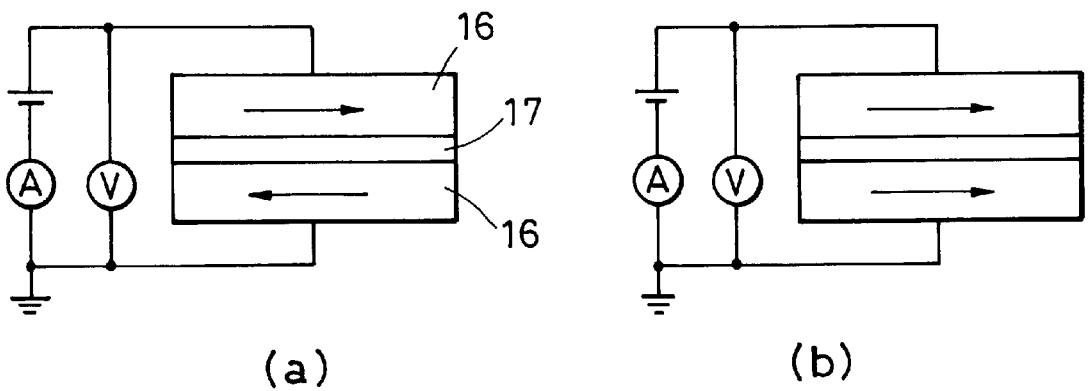
FIGS. 3A and 3B are drawings illustrating examples of horizontal magnetization-type and perpendicular magnetization-type TMR elements, respectively.
Figure 3B:
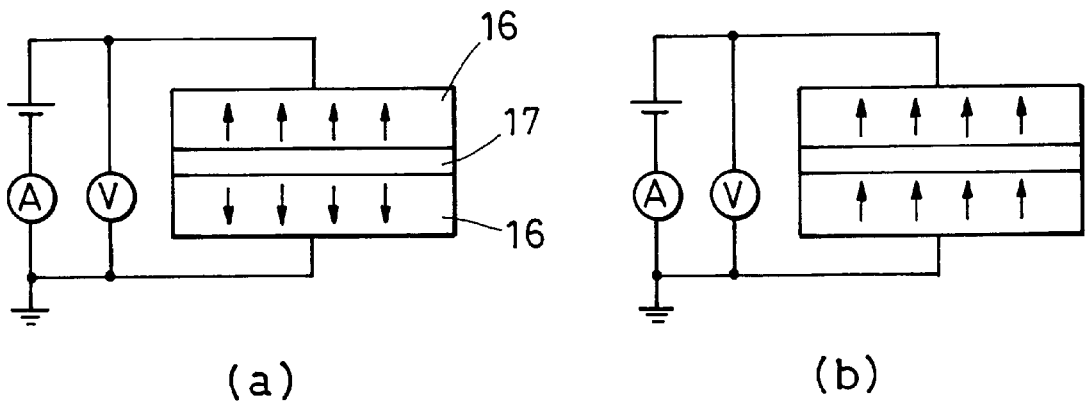
Figure 4:
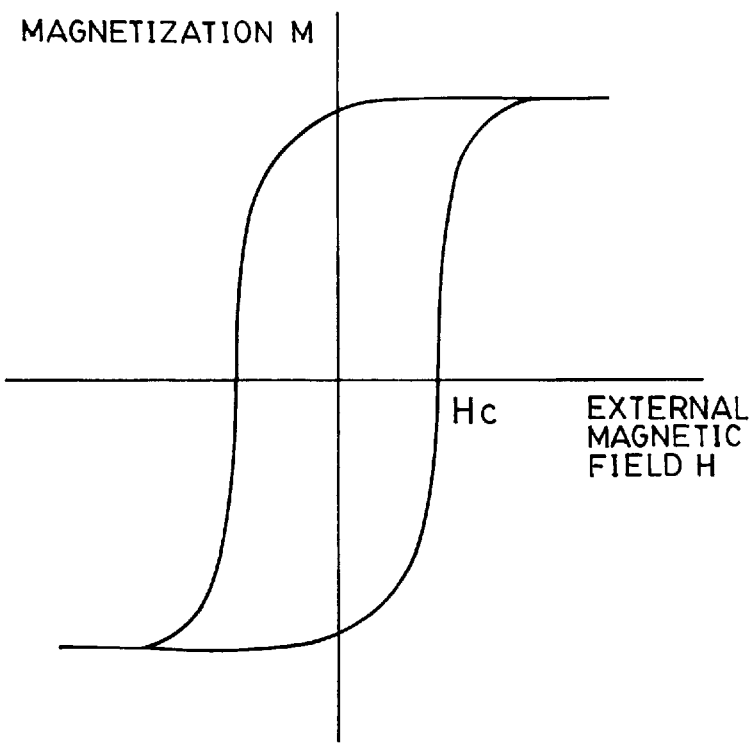
FIG. 4 is a graph showing a magnetization curve for illustrating the magnetization characteristics of a magnetic material.

FIG. 3A shows a horizontal magnetization-type TMR element in which magnetization produced in each of the magnetic layers 16 is parallel to the film plane, i.e., the direction of the easy magnetization axis is parallel to the film plane. FIG. 3B is a perpendicular magnetization-type TMR element in which magnetization produced in each of the magnetic layers 16 is perpendicular to the film plane, i.e., the direction of the easy magnetization axis is perpendicular to the film plane. The perpendicular magnetization type is preferred because it can be miniaturized when being used as a memory element.

Particularly, in the perpendicular magnetization-type TMR element, in reversal of magnetization of a recording layer, magnetization of the recording layer can easily be reversed by applying magnetic fields in the direction of the easy magnetization axis and the direction perpendicular to the easy magnetization axis.

For the magnetic films of the hard and soft layers, for example, a metal material, an alloy, and the like can be used. In addition, an insulating layer 17 is preferably made of an oxide insulating material such as $Al_2O_3$ or the like because a preferred potential barrier can easily be obtained. The TMR element has a high electric resistance value in the antiparallel state, and a low electric resistance value in the parallel state.

Figure 5:
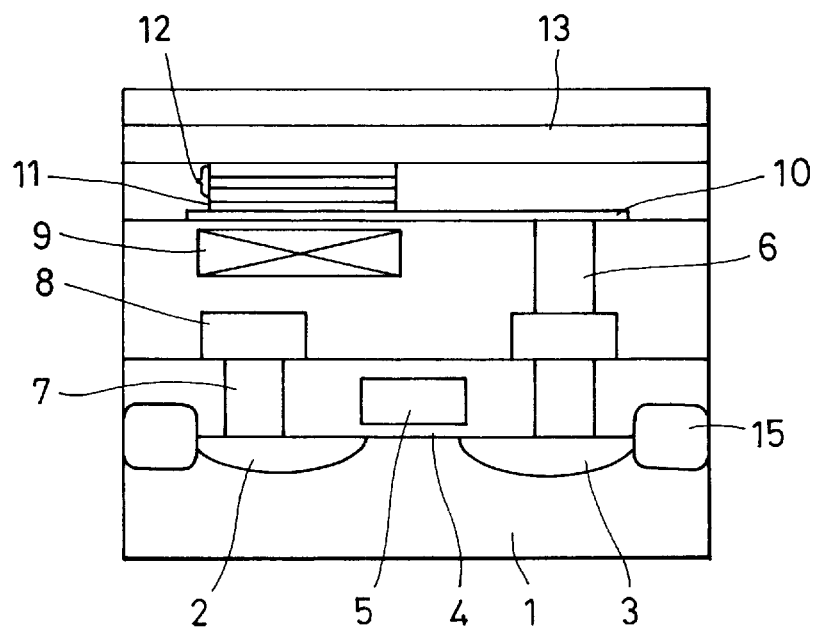
FIG. 5 is a schematic sectional view showing an example of the cell structure of a memory cell using an in-plane magnetic film.

FIG. 5 is a sectional view showing an example of the cell structure of a horizontal magnetization-type memory cell. As shown in FIG. 5, a field effect transistor comprising n-type diffusion regions 2 and 3, a gate insulating film 4, and a gate electrode 5 is formed on a p-type semiconductor substrate 1. The field effect transistor is isolated by isolation regions 15.

One terminal of a TMR element 12 serving as a memory element is connected to the n-type diffusion region 3 through local wiring 10 and a contact plug 6. The other terminal of the TMR element 12 is connected to a bit line 13. The n-type diffusion region 2 is connected to grounding wire 8 through a contact plug 7. A write line 9 is arranged to cross the bit line 13.

In a writing operation, the external magnetic fields induced by passing a current through each of the write line 9 and the bit line 13 are applied to change only the magnetization directions of the magnetic layers of the selected TMR element 12.

In the horizontal magnetization-type memory cell, the write line 9 is arranged below the TMR element 12 so that the magnetic field induced by a write current is horizontal relative to the film plane of the TMR element 12.

Figure 6:
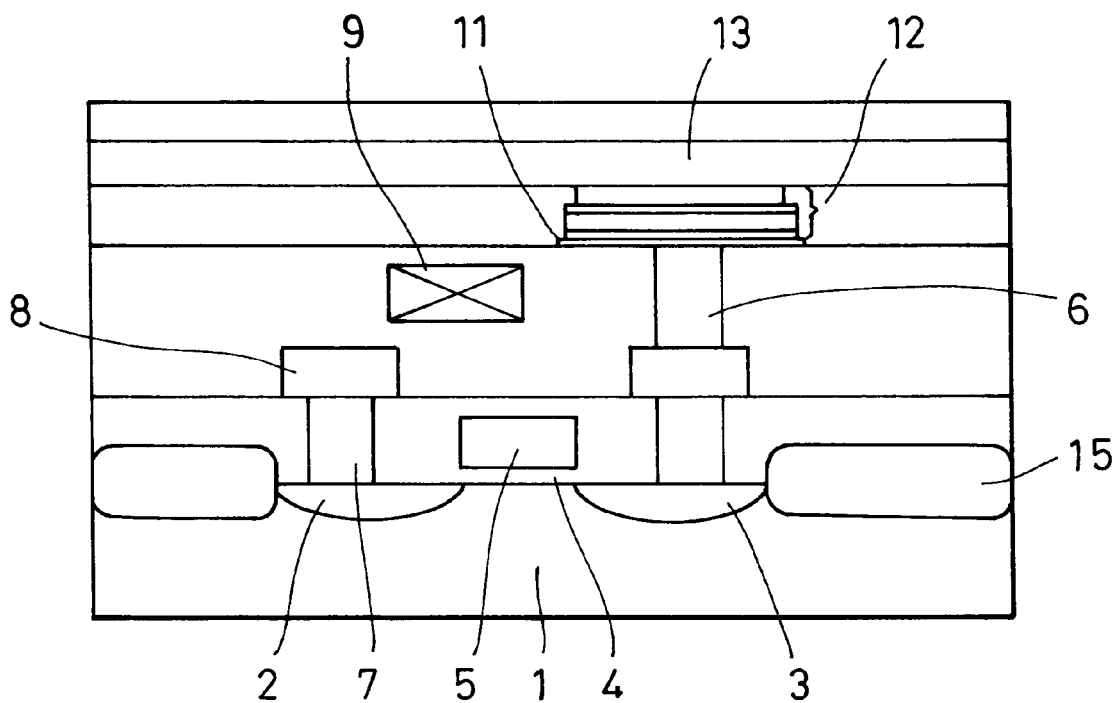
FIG. 6 is a schematic sectional view showing an example of the cell structure of a memory cell using a perpendicular magnetic film.

FIG. 6 is a sectional view showing an example of the cell structure of a perpendicular magnetization-type memory cell. The write line 9 is arranged by the side of the TMR element 12 so that a magnetic field induced by a write current is substantially perpendicular to the film plane of the TMR element 12.

In reading out information, a field effect transistor (for example, the field effect transistor Tb1 connected to the bit line BL1) of a bit line connected to a sense amplifier is turned on, and the voltage of the bit line is compared with the reference voltage Ref. As the reference voltage Ref., the predetermined voltage supplied to a power supply may be used, the voltage produced at a dummy cell for producing the reference voltage may be used, or the voltage produced by reversing the state of a cell under the reading operation may be input.

Figure 7:
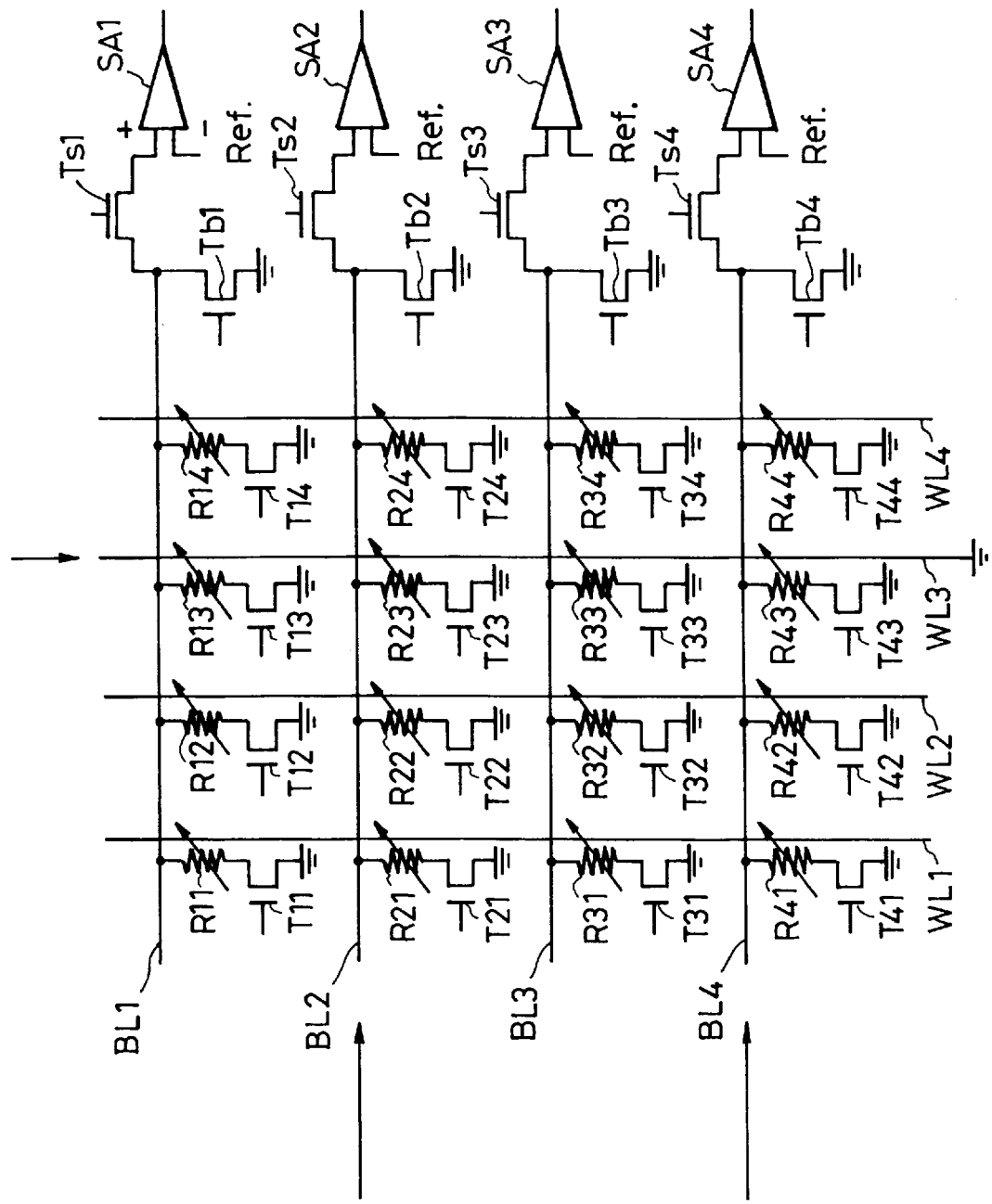
FIG. 7 is a drawing illustrating the operation of writing antiparallel magnetization information on memory elements.
Figure 8:
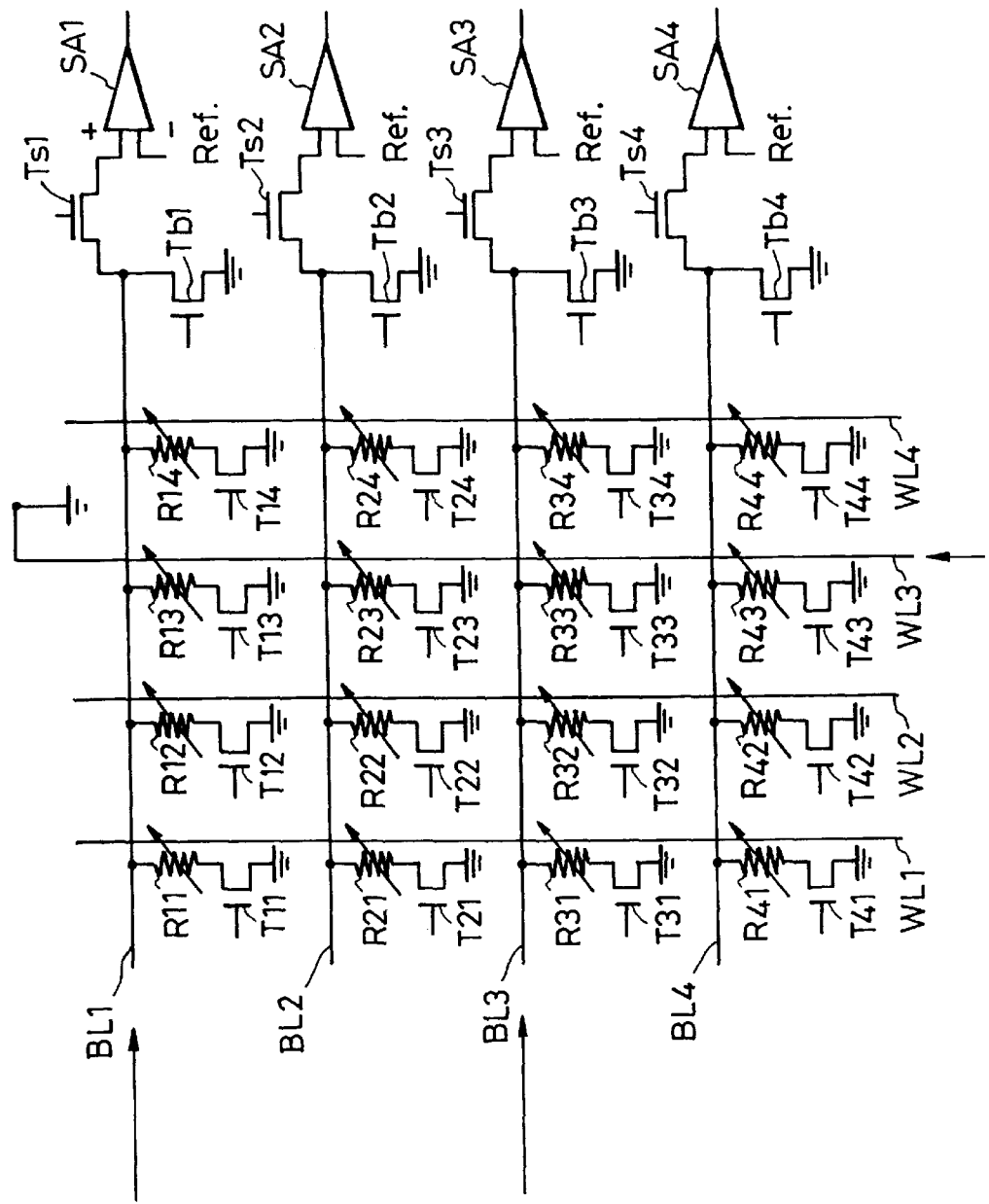
FIG. 8 is a drawing illustrating the operation of writing parallel magnetization information on memory elements.

The information writing operation of the MRAM of this embodiment will be described in further detail below with reference FIGS. 7 and 8 showing an example of a 4×4 bit MRAM using horizontal magnetization-type memory elements.

A description will be made of the operation of writing information, "0", "1", "0" and "1" in memory elements R13, R23, R33 and R43, respectively. In this example, it is assumed that the hard layers are always magnetized in the same direction. When the soft layers are magnetized in antiparallel to magnetization of the hard layers, information (magnetization information) "1" is written in, while the soft layers are magnetized in parallel to magnetization of the hard layers, information (magnetization information) "0" is written in. Namely, information is recorded by using the magnetization directions of the soft layers.

First, as shown in FIG. 7, a pulse is applied so that a current flows through the write line WL3 in the direction of an arrow, and at the same time, current pulses are applied to the bit lines BL2 and BL4 to apply magnetic fields to the recording layers (in this example, the soft layers) of the TMR elements R23 and R43 so that magnetizations are antiparallel to each other. By supplying the current pulses to the bit lines BL2 and BL4, information "1" is written in the memory elements R23 and R43.

Next, as shown in FIG. 8, a current pulse is passed through the write line WL3 in the direction of an arrow (the direction opposite to FIG. 7), and at the same time, current pulses are supplied to the bit lines BL1 and BL3 to write parallel magnetizations in the recording layers of the TMR elements R13 and R33 by the induced magnetic fields. By this operation, information "0" is written in the TMR elements R13 and R33.

Figure 9:
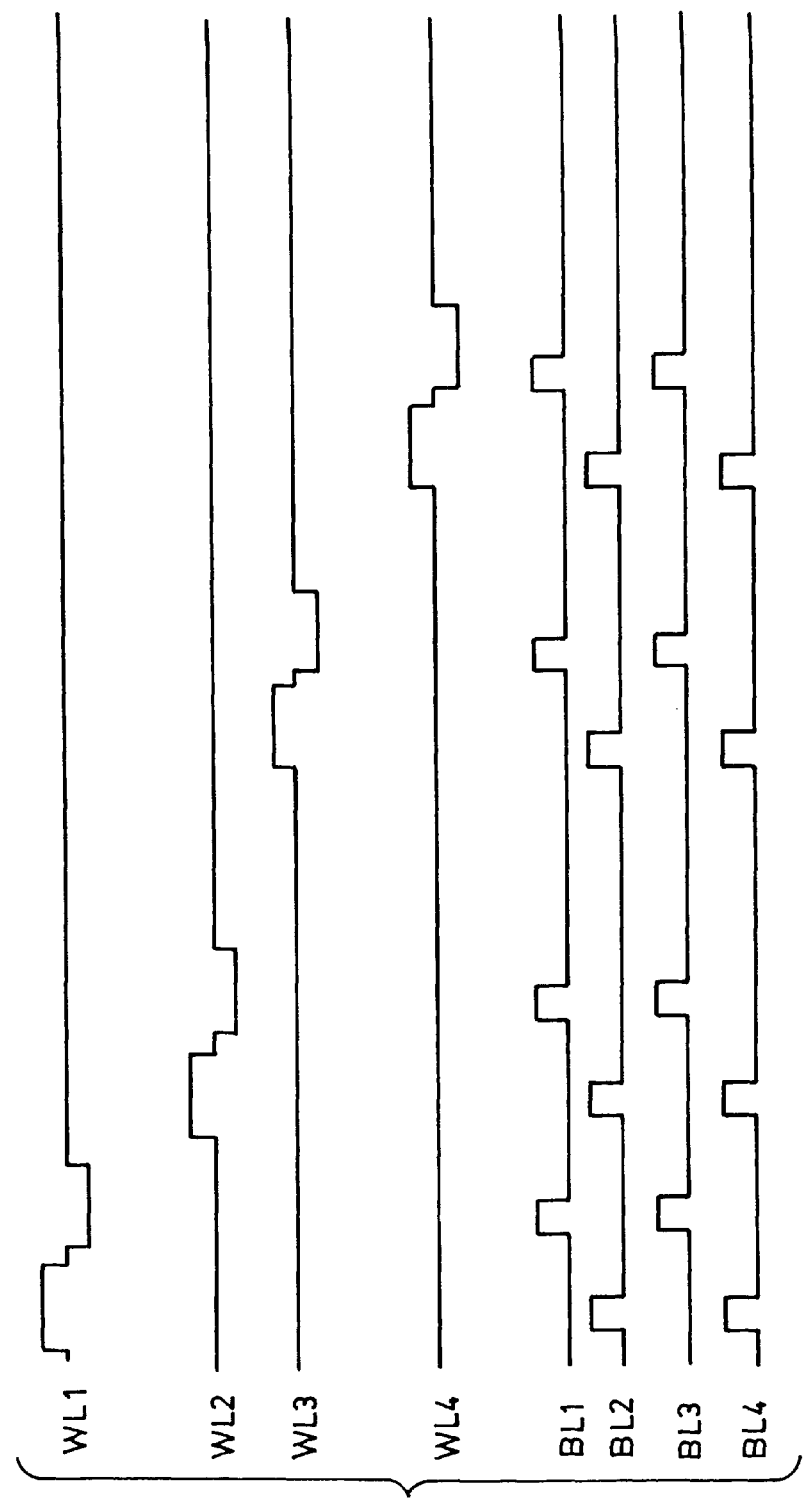
FIG. 9 is a time-sequence diagram showing timing of each of the current pulses applied in the operations shown in FIGS. 7 and 8.

FIG. 9 is a time-sequence diagram of timing of the pulse applied to each of the write lines and bit lines when information "0" is recorded on the memory elements arranged in the odd-numbered rows, and information "1" is recorded on the memory elements arranged in the even-numbered rows for all memory elements arranged in a 4×4 matrix. FIG. 9 indicates that a pulse for writing "0" or "1" is applied once to each of the write lines to permit writing of information in all memory elements disposed for the write lines. Therefore, the total amount of the current can be decreased, as compared with the case in which a current pulse is passed through each of the write lines the same number of times as the number of the memory elements.

In this writing method, the effect of decreasing the amount of the current increases with an increase in the number of the memory elements in which information is written by one write line (referred to as "access" hereinafter). For example, consideration is given to 32-bit parallel writing in which one write line WL accesses 32 memory elements. In this writing method, in order to perform 32-bit parallel writing, a current pulse is passed through one write line twice, and a current pulse is passed through each of 32 bit lines once. The total current required in the writing method is about half of the current required in the case in which in order to write in the 32 memory elements, a current pulse is passed through a write line 32 times, and a current pulse is passed through each of the 32 bit lines once.

In this embodiment, the current required for driving the MRAM can be decreased to decrease power consumption.

Second Embodiment

In this embodiment, the TMR element shown in FIG. 3A in which magnetization is horizontal relative to the film plane is used as a memory element.

In this embodiment, it is assumed that the hard layers are used as recording layers so that information is recorded by using the magnetization directions of the hard layers. This embodiment is a differential detection type in which in reading out information, the magnetization directions of the soft layers (free layers) are switched to read out information. Also, information is read out of the each of TMR elements by comparing the electric resistance values of the TMR element before and after magnetization reversal of the free layer.

Since the magnetization directions of the hard layers are maintained unless an external magnetic field is applied, a nonvolatile memory can be realized. First, a circuit configuration is described with reference to FIG. 10. The same portions having the same functions as FIG. 2 are denoted by the same reference numerals, and description thereof is omitted.

In this embodiment, a sense amplifier is a signal detection circuit outputting information "1" or "0" according to the result of comparison between the levels of two input voltages. Each sense amplifier compares the changes of the voltage of the corresponding bit line by, for example, switching Ts1 and Ts1'.

In writing information, currents are supplied to both of desired bit line and write line. The current passed through the write line applies a magnetic field to the selected cell in a direction parallel to the easy magnetization axis and horizontal relative to the film plan. On the other hand, the current passed through the bit line applies a magnetic field to the selected cell in a direction horizontal relative to the film plane and perpendicular to the easy magnetization axis. Therefore, the current flowing through the write line applies a magnetic field in the direction of the easy magnetization axis, and the current flowing through the bit line applies a magnetic field in a direction different from the easy magnetization axis.

A description will now be made of the process for manufacturing a bit of the MRAM comprising, as memory elements, magnetoresistance elements each comprising a horizontal magnetic film.

Figure 11:
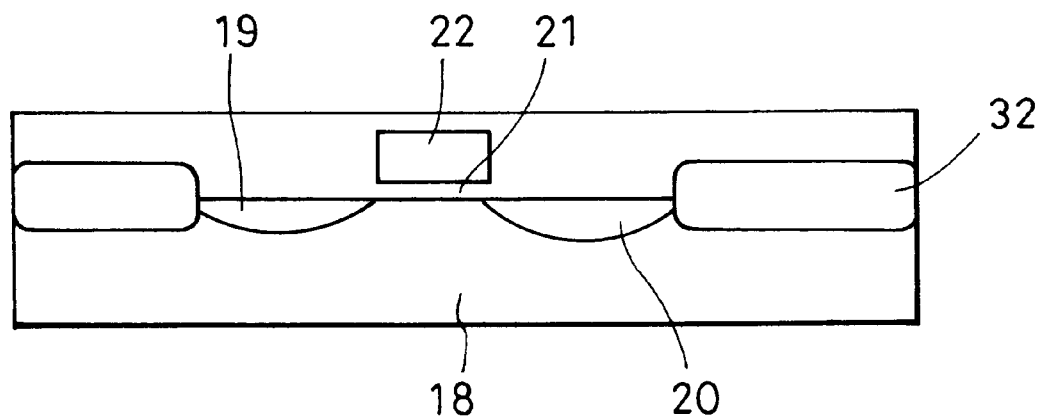
FIG. 11 is a drawing illustrating the step of forming an interlayer insulating layer on an underlying substrate according to the second embodiment.

First, as shown in FIG. 11, a field effect transistor comprising embedded isolation regions 32, n-type diffusion regions 19 and 20, a gate insulating film 21 and a gate electrode 22 is formed on an n-type silicon substrate 18 to prepare an underlying substrate. The embedded isolation regions 32 are made of $SiO_2$, the gate insulating film 21 is made of $SiO_2$, and the gate electrode 22 is made of polycrystalline silicon.

Figure 12:
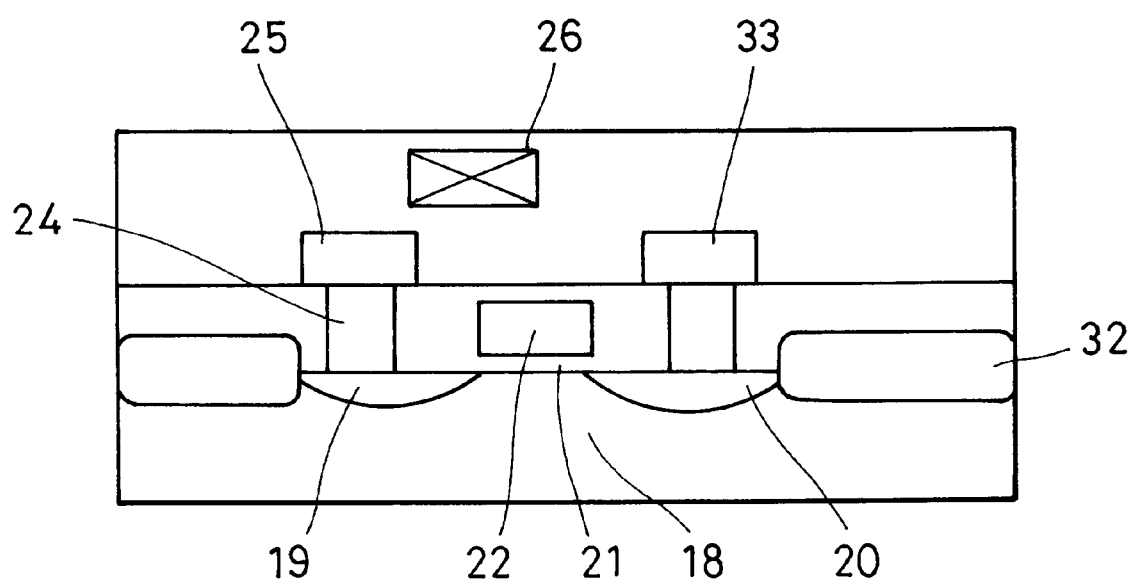
FIG. 12 is a drawing illustrating the step of embedding a tungsten plug and wiring according to the second embodiment.

Next, as shown in FIG. 12, tungsten plugs 24 are buried in contact with the n-type diffusion regions 19 and 20, respectively. Then, a Ti/AlSiCu/Ti layer is formed, and then via 33 and a ground wire 25 are formed by a photolithography process. Furthermore, an interlayer insulating film is formed. Next, the interlayer insulating film is grooved, and then a write line 26 made of copper is formed by a copper embedding process comprising a plating process. Furthermore, an interlayer insulating thin film is formed.

Figure 13:
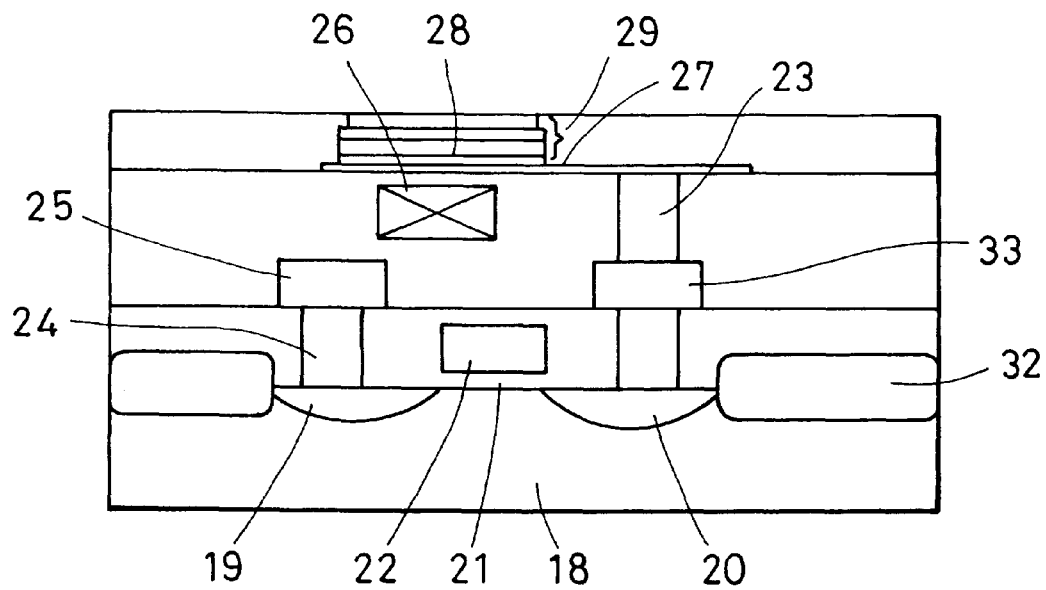
FIG. 13 is a drawing illustrating the step of forming a memory element according to the second embodiment.

Next, as shown in FIG. 13, a contact hole is formed above the via 33, and a tungsten plug 23 is buried in contact with the via 33. Furthermore, local wiring made of TiN, a lower electrode layer 28 made of AlCu/TiN, and a TMR layer 29 comprising a laminated film of copper upper electrode/Co/$Al_2O_3$/NiFe are successively formed. The $Al_2O_3$ tunnel insulating film has a thickness of about 2 nm, and is formed by oxidizing an Al metal in plasma. Next, the TMR layer 29 is processed by a photolithography process, and then an interlayer insulating film is formed. Then, the interlayer insulating film is polished by a chemical mechanical polishing method (CMP method) to expose the copper upper electrode.

Figure 14:
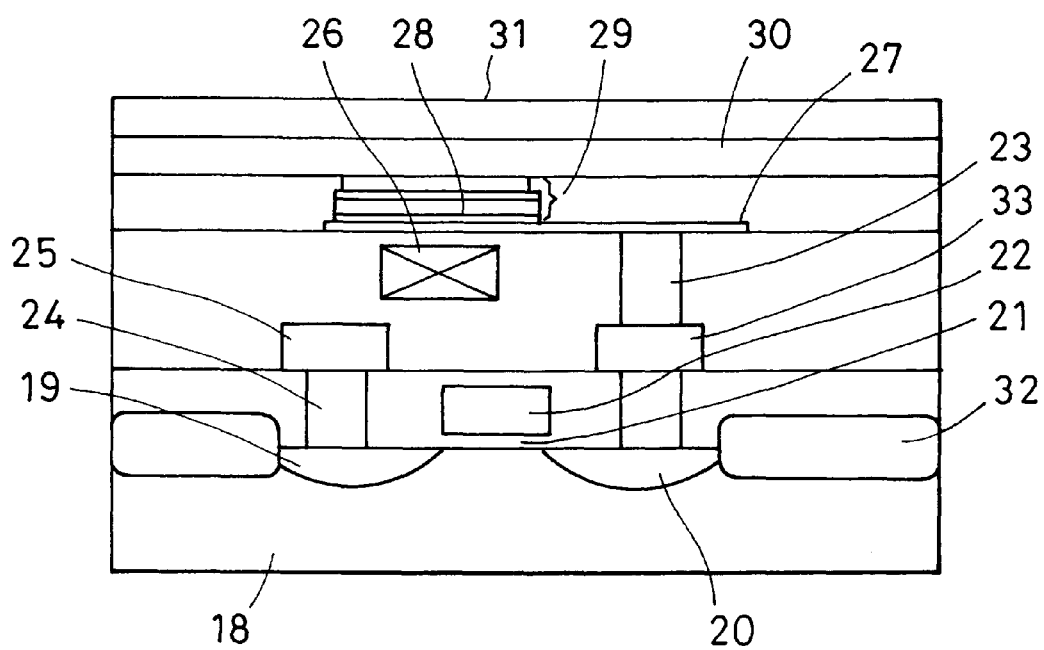
FIG. 14 is a drawing illustrating the step of forming a bit line and a protecting film according to the second embodiment.

Next, as shown in FIG. 14, the interlayer insulating film is grooved, and then a copper bit line 30 is formed by a copper embedding process including a plating process. Finally, a protecting layer 31 made of $SiN/SiO_2$ is formed, and an opening is formed in a pad area to complete one bit.

Figure 10:
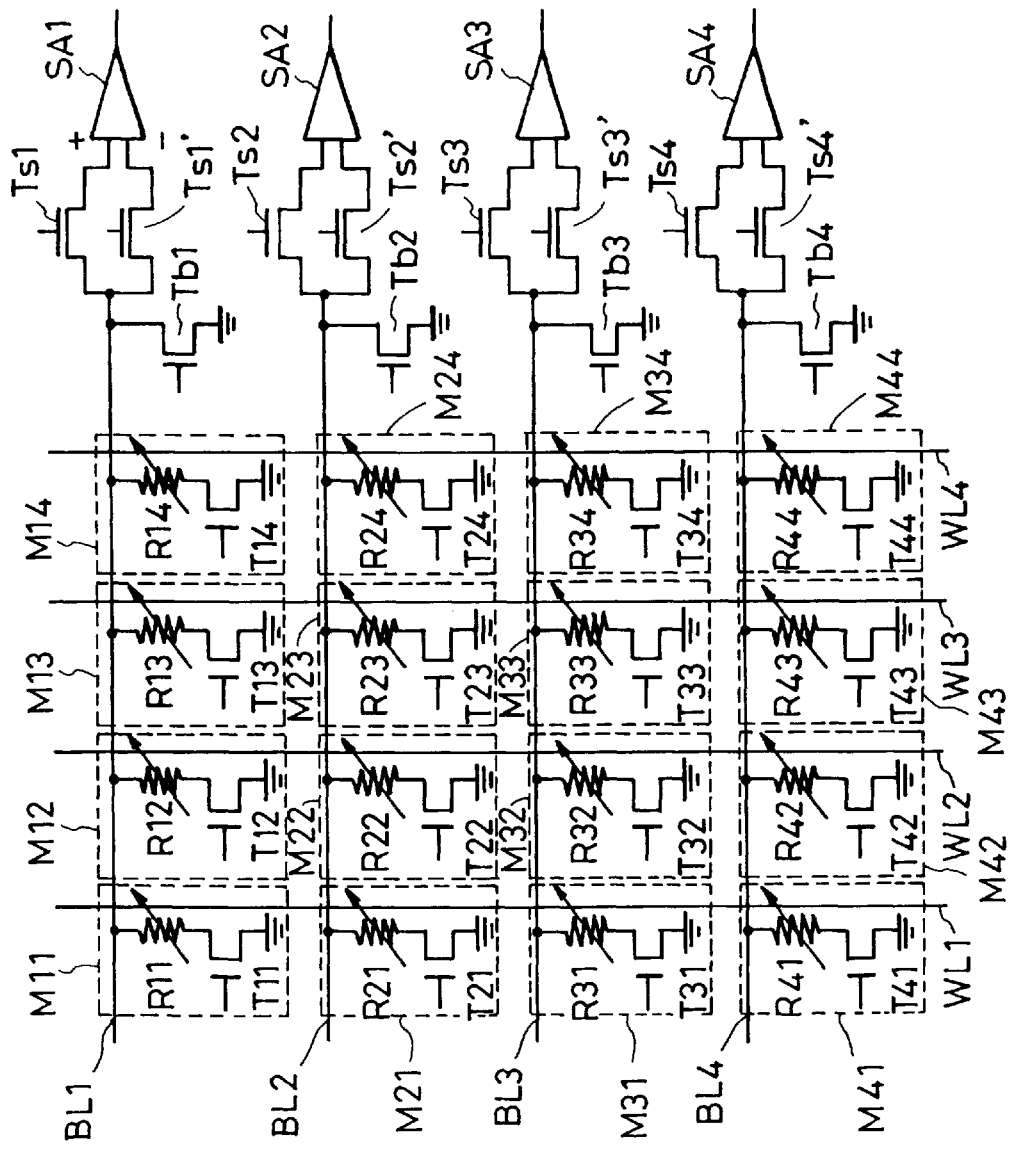
FIG. 10 is a drawing of a circuit according to a second embodiment.

By the above-described process, a 4×4 bit chip having the circuit configuration shown in FIG. 10 was manufactured by way of experiment.

In experiment, current pulses were passed through bit lines and write lines of the chip to write and read out, in parallel, information of "0", "0", "0" and "0" in and from the four cells in one column, respectively.

Figure 15:
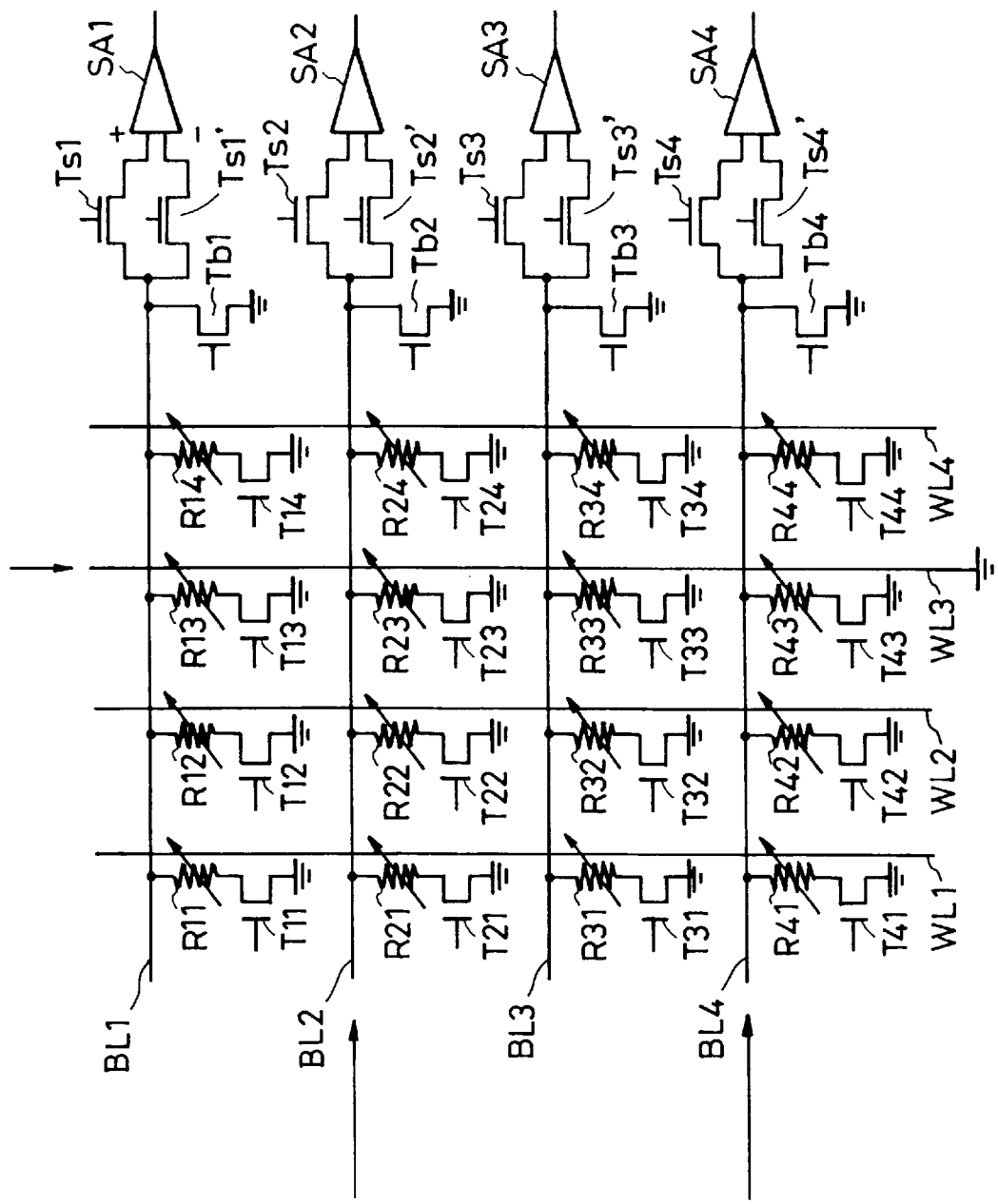
FIG. 15 is a drawing illustrating the operation of writing information "0" according to the second embodiment.

First, a pulse signal of a voltage of 3.3 V was input to the write line WL3 and the bit lines BL2 and BL4 so that currents flowed in the directions shown in FIG. 15.

Figure 16:
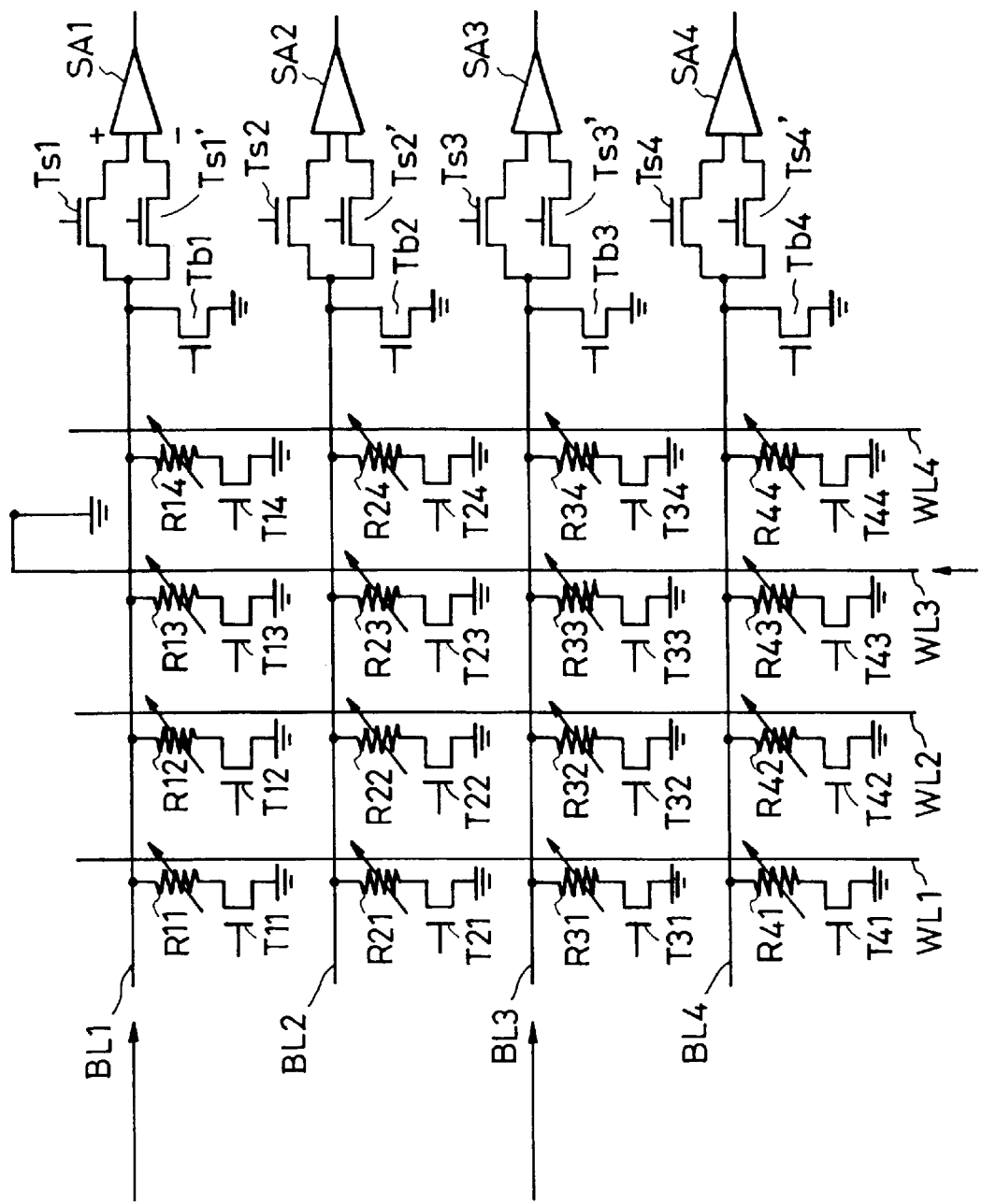
FIG. 16 is a drawing illustrating the operation of writing information "1" according to the second embodiment.

Next, a pulse signal of a voltage of 3.3 V was input to the write line WL3 and the bit lines BL1 and BL3 so that currents flowed in the directions shown in FIG. 16. When information is recorded on all memory elements, a pulse may be applied to each of wirings, for example, as shown in FIG. 9.

At this time, magnetization in the rightward direction in FIG. 15 occurred in the hard layer (Co layer) of each of the TMR elements R13 and R33 to write information "0". In the hard layer (Co layer) of each of the TMR elements R23 and R43, magnetization in the leftward direction in FIG. 16 occurred to write information "0".

Figure 17:
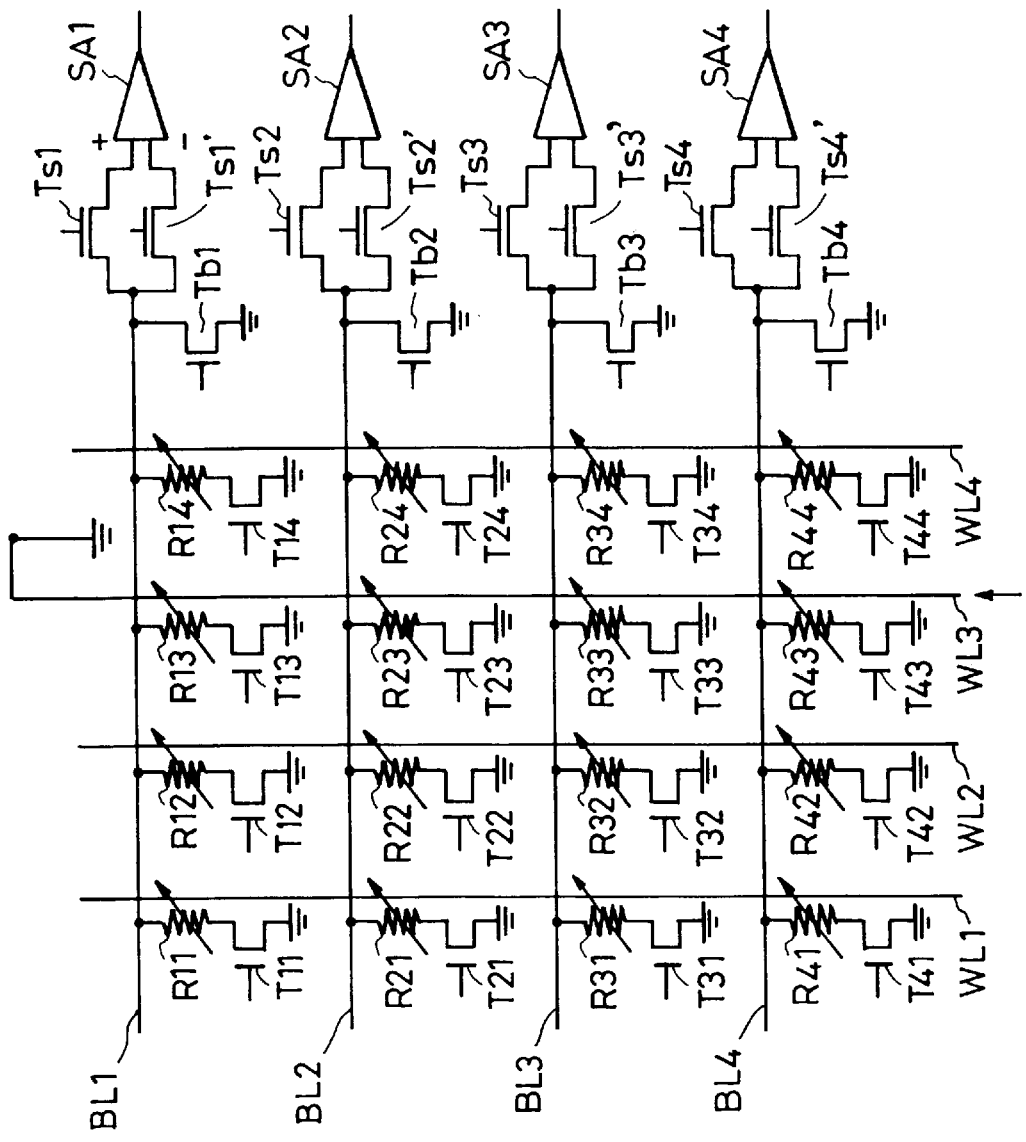
FIG. 17 is a drawing illustrating the operation of applying a current pulse to memory elements to magnetize elements in a direction during a readout operation.

Next, the operation of reading out the written information was performed. First, a pulse signal of a voltage of 3.3 V was applied to only the write line WL3 so that a current flowed in the direction shown in FIG. 17, producing rightward magnetization in the soft layer (NiFe layer) of each of the TMR elements R13 to R43.

At this time, in each of the TMR elements R13 and R33, magnetizations of the hard layer and soft layer were parallel to each other to establish a low-resistance state. In each of the TMR elements R23 and R43, magnetizations of the hard and soft layers were antiparallel to each other to establish a high-resistance state.

Figure 18:
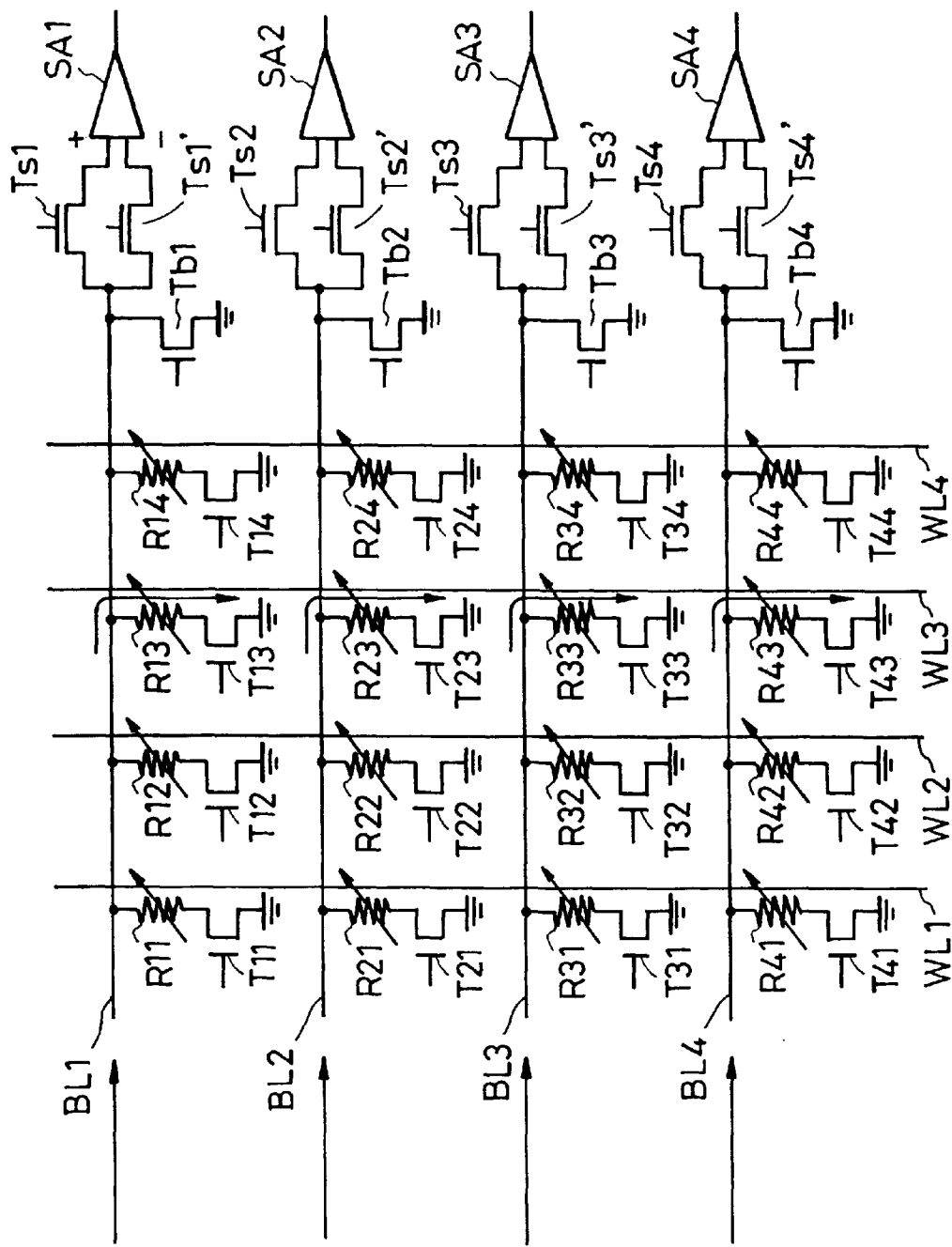
FIG. 18 is a drawing illustrating the operation of inputting the resistances of the magnetized memory elements shown in FIG. 17 to sense amplifiers.

Next, as shown in FIG. 18, the transistors T13 to T43 were turned on, and a constant current of about 10 $\mu$A was passed through the bit lines to respectively input the potentials of the bit lines to the side input terminals of the sense amplifiers with the transistors Ts1 to Ts4 turned on.

Figure 19:
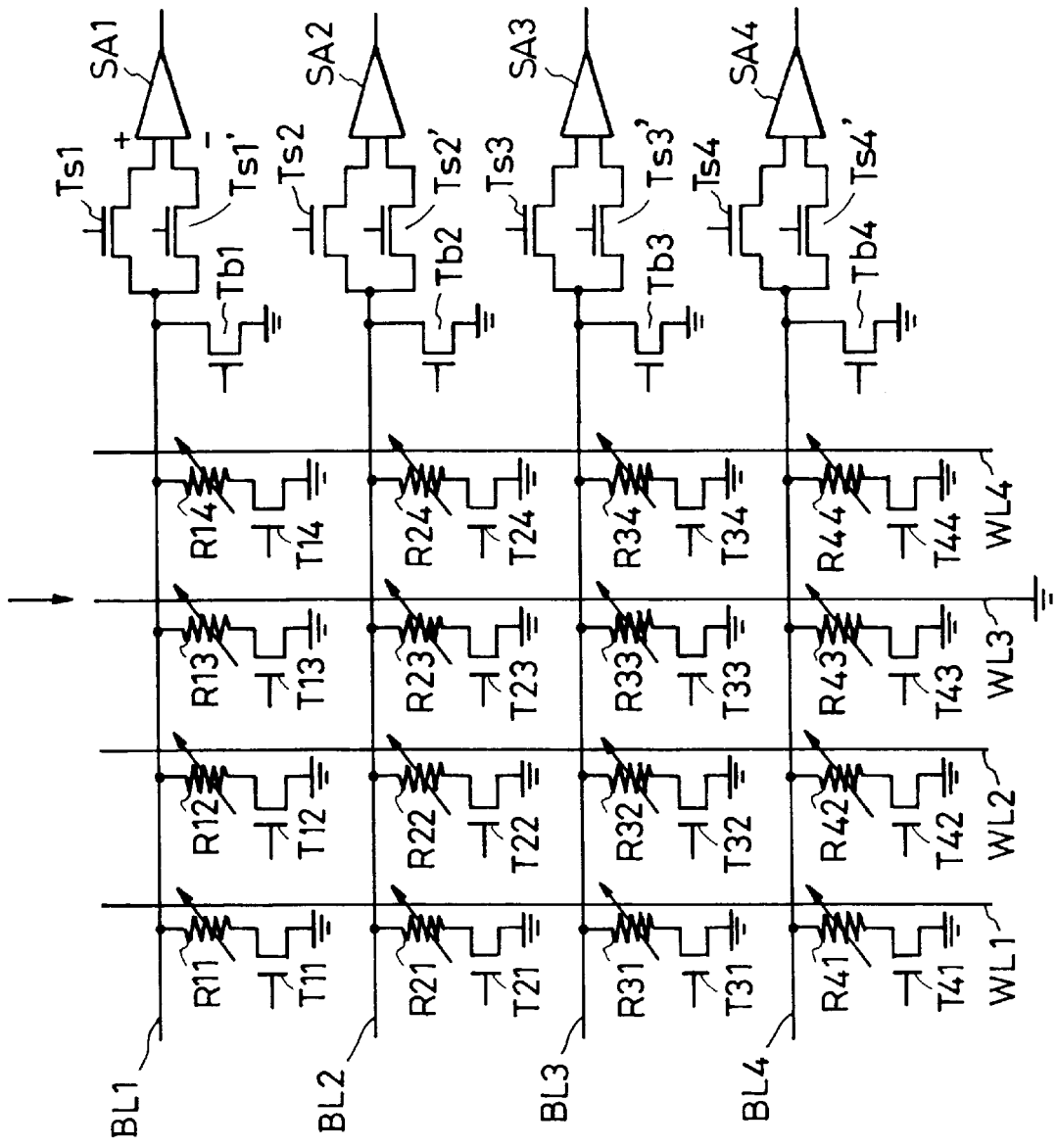
FIG. 19 is a drawing illustrating the operation of applying a current pulse to memory elements to magnetize the elements in the direction reverse to FIG. 17.

Next, a pulse signal of a voltage of 3.3 V was applied to only the write line WL3 so that a current flowed in the direction shown in FIG. 19, producing leftward magnetization in the soft layer of each of the TMR elements R13 to R43.

At this time, in each of the TMR elements R13 and R33, magnetizations of the hard layer and soft layer were antiparallel to each other to establish a high-resistance state. In each of the TMR elements R23 and R43, magnetizations of the hard and soft layers were parallel to each other to establish a low-resistance state.

Figure 20:
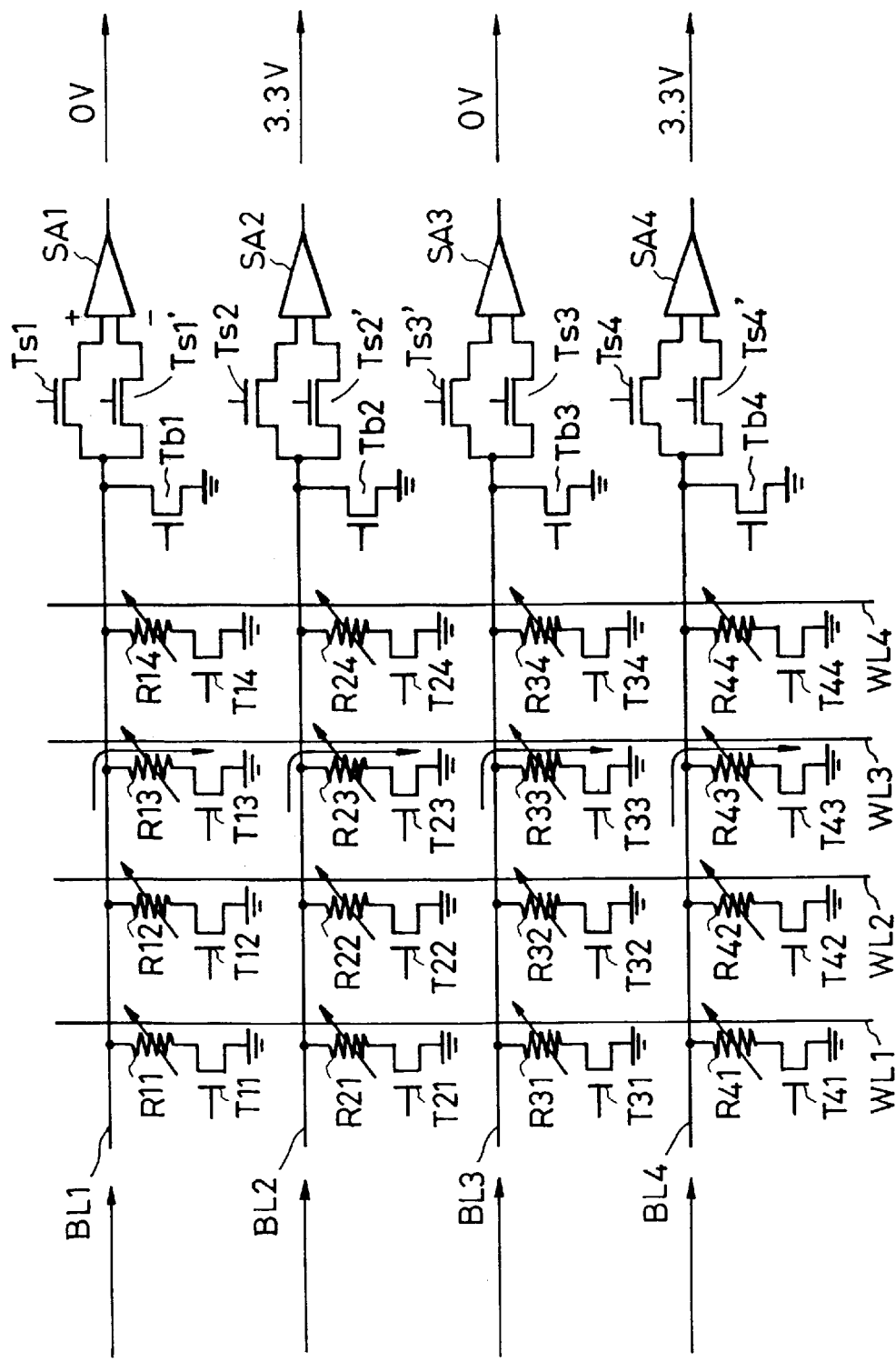
FIG. 20 is a drawing illustrating the operation of inputting the resistances of the magnetized memory elements shown in FIG. 19 to sense amplifiers.
Figure 21:
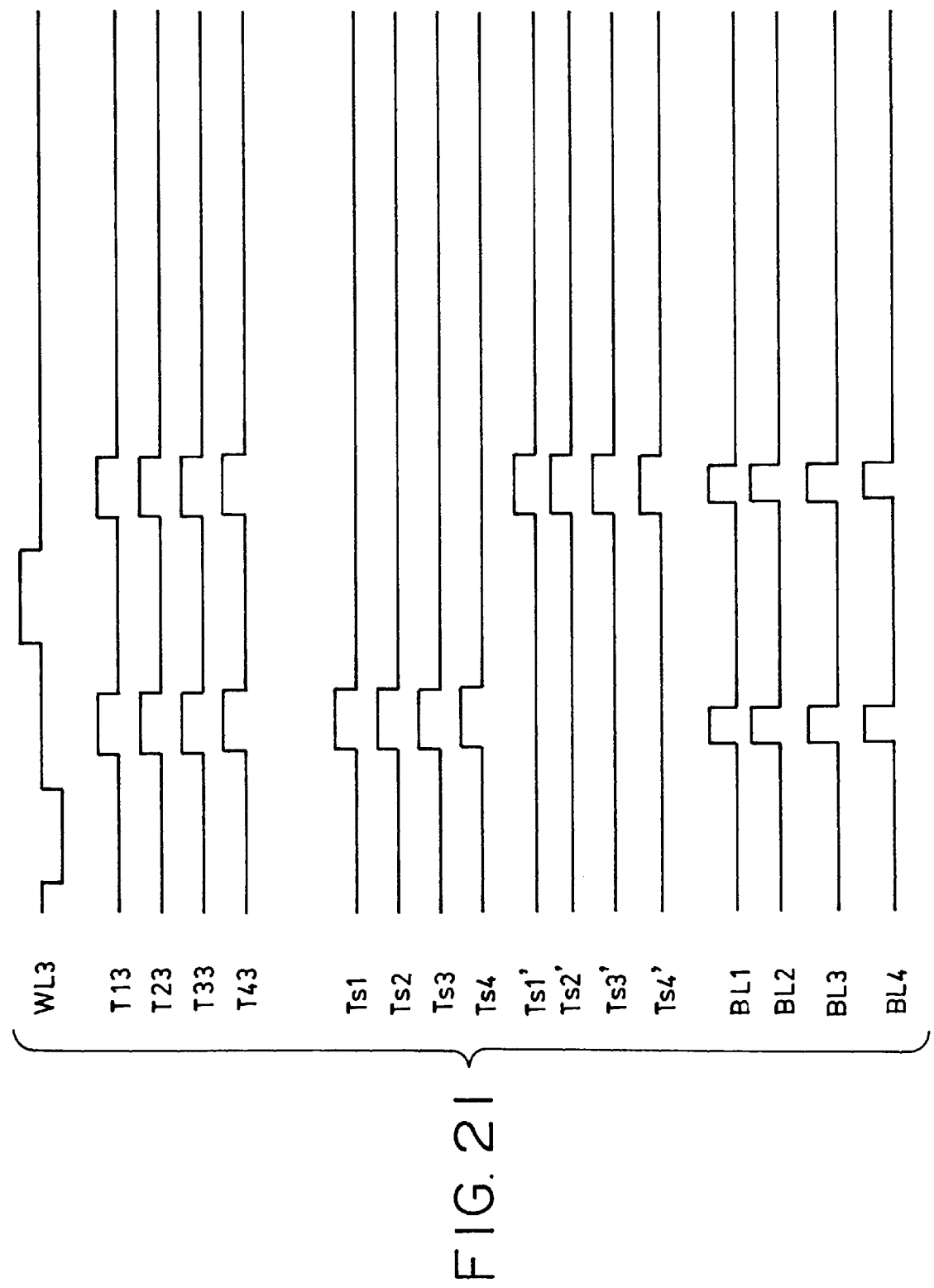
FIG. 21 is a time-sequence diagram showing the current pulses applied in the operations shown in FIGS. 17 to 20.

Next, as shown in FIG. 20, the transistors T13, T23, T33 and T43 were turned on, and a constant current of about 10

µA was passed through the bit lines BL1, BL2, BL3 and BL4 to respectively input the potentials of the bit lines to the-side input terminals of the sense amplifiers with the transistors Ts1', Ts2', Ts3' and Ts4' turned on. FIG. 21 is a time-sequence diagram of the pulses applied to each of wirings and transistors during reproduction in the circuit show in FIGS. 17 to 20.

As a result, the outputs of the sense amplifiers SA1 and SA3 were 0 V, and the outputs of the sense amplifiers SA2 and SA4 were 3.3 V. This means that information of "0", "0", "0" and "0" are normally written in the TMR elements R13, R23, R33 and R43, respectively. Therefore, it was recognized that in this embodiment, by passing a current through a write line once in each of opposite directions, information can be normally written in all memory elements arranged in the same column. Furthermore, information written in parallel can be read out in parallel, thereby improving the readout speed.

Third Embodiment

Figure 22:
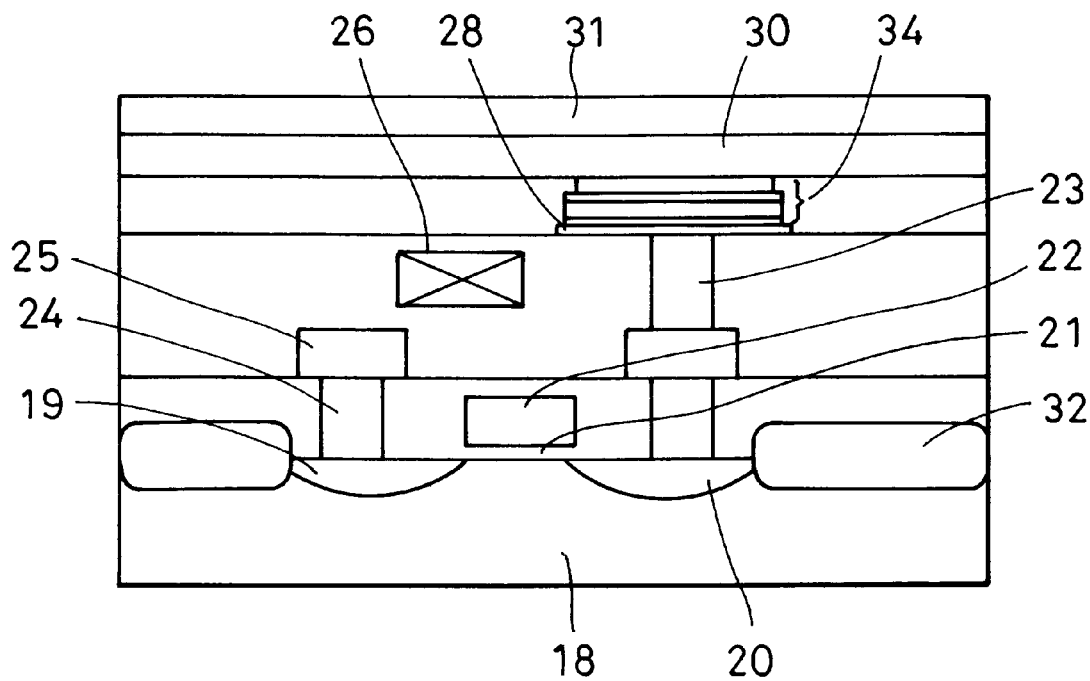
FIG. 22 is a schematic sectional view showing a memory element according to a third embodiment.

In this embodiment, the TMR element shown in FIG. 3B in which magnetization is perpendicular to the film plane is used as a memory element. FIG. 22 is a sectional view of the memory element.

In this embodiment, a memory element is provided directly above the drain region of each FET without the local wiring in the manufacturing process of the second embodiment. The portions having the same functions as FIG. 14 are denoted by the same reference numerals, and detailed description thereof is omitted. In FIG. 22, a TMR element 34 comprises a laminated film of $GdFe/Al_2O_3/GdFe$, and a magnetic film comprises a ferrimagnetic material having the easy magnetization axis in the direction perpendicular to the film plane. Also, a copper write line 26 is disposed by the side of the TMR element 34. Therefore, by supplying a write current to the write line 26, perpendicular magnetization is applied to the TMR element 34.

By using the memory element, a 4×4 bit chip having the circuit configuration shown in FIG. 9 was manufactured. Like in the second embodiment, in experiment, current pulses were passed through bit lines and write lines of the chip to write and read out, in parallel, information of "0", "0", "0" and "0" in and from the four cells in one row, respectively.

First, as shown in FIGS. 15 and 16, information was recorded on all memory elements arranged near the write line WL3 under recording of information. This operation was performed for all write lines. Then, as shown in FIGS. 17 to 20, pulses were applied to read out information. As a result, it was recognized that desired information can be normally written in all memory elements in the same manner as the second embodiment.

Furthermore, since a perpendicular magnetic film is used for each of the memory elements, the write lines are arranged so that a magnetic field produced by a write line is applied perpendicular to the film plane, and a magnetic field produced by a bit line is applied in a direction inclined from the direction perpendicular to the film plane, preferably the direction perpendicular to the direction. In this case, pulses are applied to the bit lines connected to the memory elements under recording of information, thereby permitting application of a magnetic field perpendicular to the magnetic field due to the write line.

Although, in this embodiment, information is read out by the same differential detection method as the second embodiment, information may be read out by an absolute detection method in which information is recorded on the soft layers with the hard layers having fixed magnetization, like in the first embodiment.

Fourth Embodiment

Figure 23:
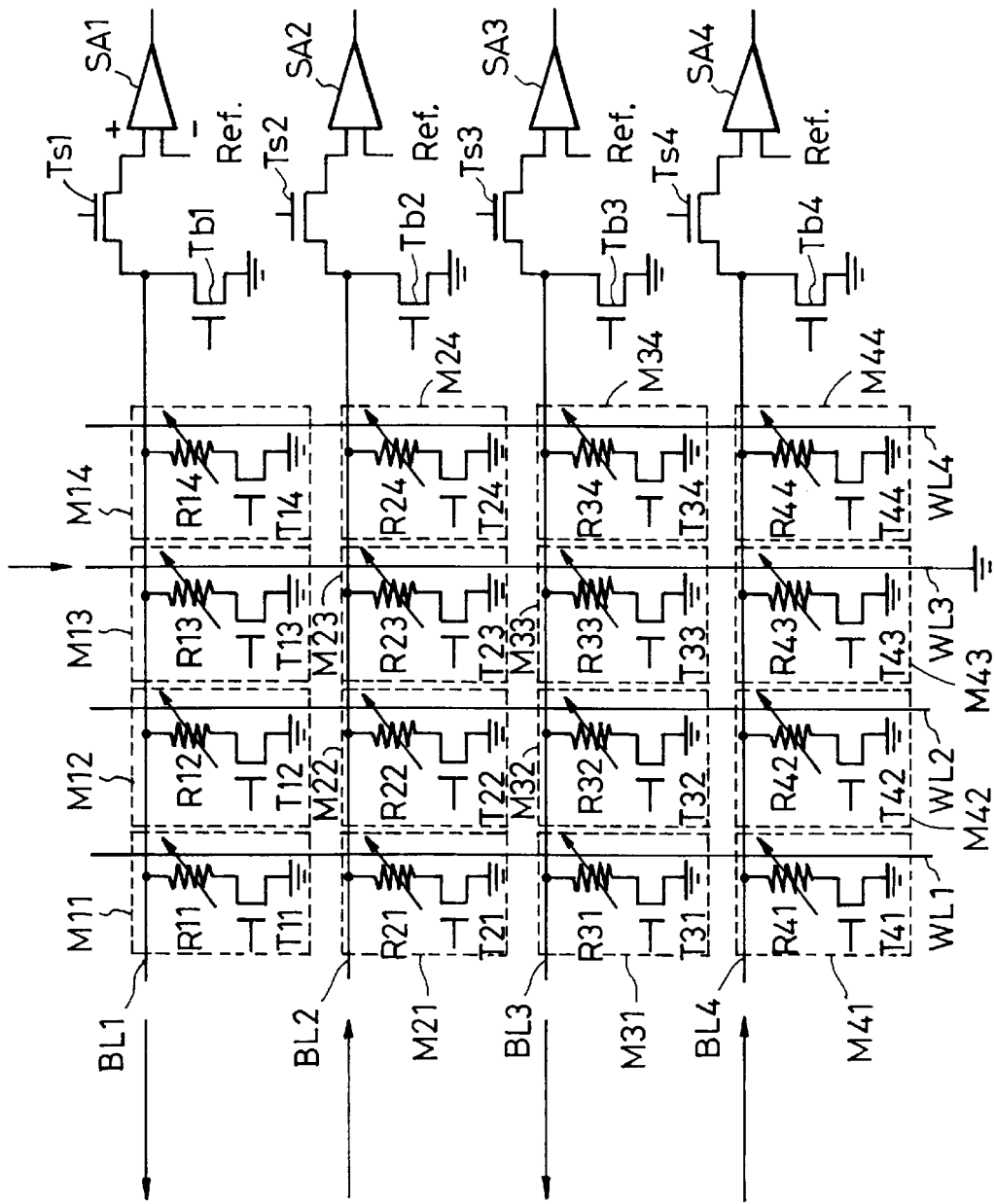
FIG. 23 is a drawing illustrating a method of driving an MRAM according to a fourth embodiment.

In this embodiment, an MRAM comprises a plurality of first wirings for applying magnetic fields in the direction of the easy magnetization axis, and a plurality of second wirings for applying magnetic fields in a direction inclined from the direction of the easy magnetization axis of a magnetic layer. The MRAM has a circuit configuration in which memory cells are arranged in a matrix so that a current is passed through one of the second wirings to apply an assist magnetic field to all memory elements arranged in a same row or column of the rows or columns of a plurality of memory elements arranged parallel to the second wirings, and a pulse is applied to each of the plurality of first wirings in the direction corresponding to the information to be recorded on each memory element synchronously with the current pulse passed through the second wiring to apply a magnetic field to each of magnetoresistance elements, recording information on the plurality of memory elements arranged in the same row or column. FIG. 23 is a drawing illustrating a driving method for recording. Description will be made of the operation of writing information "0", "0", "0" and "0" in the memory elements R13 to R43, respectively.

In this embodiment, the first wirings are used as bit lines, and the second wirings are used as write lines. The hard layers are always magnetized in the same direction. When the soft layers are magnetized in antiparallel to the hard layers, information "1" is written, while when the soft layers are magnetized in parallel to the hard layers, information "0" is written. The magnetization direction of each of the soft layers can be selected by changing the direction of the current passed through each of the bit lines. Therefore, magnetization reversal occurs in each of the memory elements positioned at the intersections of the bit lines and the write lines to write in information. A magnetic field produced by passing a current through each of the bit lines is applied in the direction of the easy magnetization axis of the memory elements. Namely, in this embodiment, the bit lines are connected to a bipolar power supply or the like to supply a current flows in two directions. Therefore, a magnetic field induced by each of the bit lines is applied in the direction of the easy magnetization axis of the memory elements to determine "0" or "0", and a magnetic field induced by each of the write lines is used as an assist magnetic field for selecting a desired memory element and recording information thereon.

Figure 24:
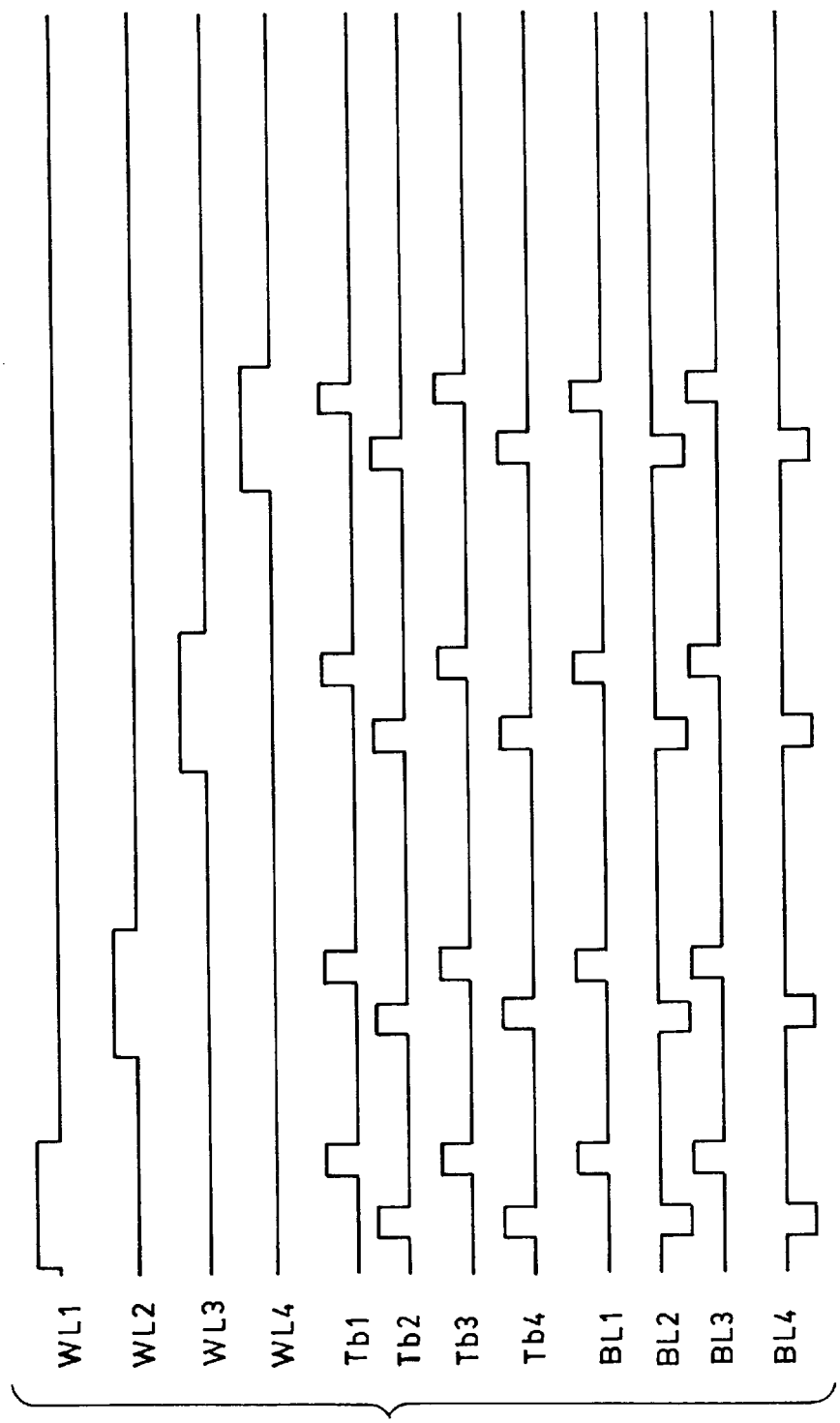
FIG. 24 is a time-sequence diagram showing the current pulses applied in the driving method shown in FIG. 23.

As shown in FIG. 23, currents are respectively passed through the bit lines BL1, Bl2, BL3 and BL4 in the directions of arrows, and the magnetic fields induced by the bit lines determine the magnetization directions of the soft layers of the TMR elements. As a result, in the recording layer (soft layer) of each of the TMR elements R23 and R43, antiparallel magnetization is written, and at the same time, in the recording layer of each of the TMR elements R13 and R33, parallel magnetization is written. At this time, the transistors Tb1 to Tb4 are turned on so that the currents flow through the bit lines. By this operation, information "0" is written in the memory elements R23 and R43. FIG. 24 is a time-sequence diagram showing an example of the pulses applied to each of wirings and transistors. Although, in FIG. 24, the timing of the pulses is shifted according to the polarities of the pulses applied to the bit lines, all pulses may be applied with the same timing.

In the above-described writing method, when information is written in the four memory elements arranged in a same column, a current may be passed through the write line WL3 once. Therefore, information can be recorded on all memory elements arranged in the same column by one action, as compared with a method in which a current is passed through the write line WL3 once at the time of writing on each of the memory elements R13, R23, R33 and R43. Therefore, the recording speed can be significantly improved. This effect increases with an increase in the number of the memory elements accessed by one write line. For example, consideration is given to 32-bit parallel writing in which a write line WL accesses to 32 TMR elements. In this case, a current is passed through a write line once, and a current is passed through each of the 32 bit lines once to complete writing. Therefore, the amount of the current supplied is about half of the case in which in order to write information in 32 memory elements, a current is passed through a pair of a write line and a bit line 32 times.

Figure 25:
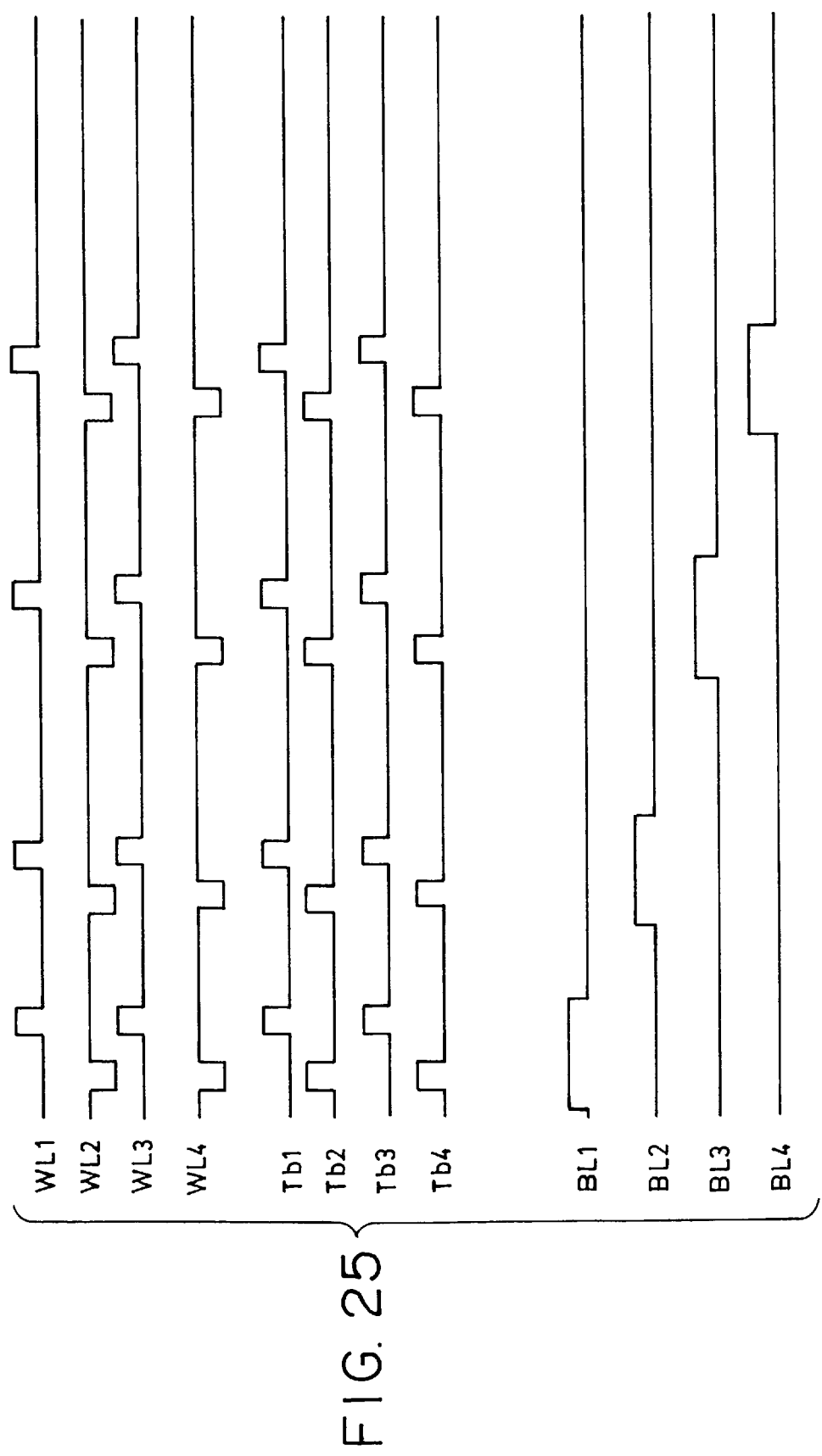
FIG. 25 is a time-sequence diagram showing the pulses applied in the driving method shown in FIG. 23 in which wiring for determining the magnetization direction is changed from bit lines to write lines.

As described above, in this embodiment, the magnetic fields induced by the bit lines determine the magnetization directions of memory elements, and the magnetic fields induced by the write lines assist magnetization reversal. Also, the bit lines and the write lines may be reversed. In this case, the applied pulses are as shown in FIG. 25. However, as described above, from the viewpoint of the readout efficiency and speed, information written in parallel is preferably read out in parallel. Therefore, the configuration of this embodiment is more preferred.

Fifth Embodiment

In this embodiment, a TMR element having a structure in which a tunnel insulating film is sandwiched between two magnetic film magnetized in the film plane is used as a memory element, and information is read out by the differential detection method.

Figure 26:
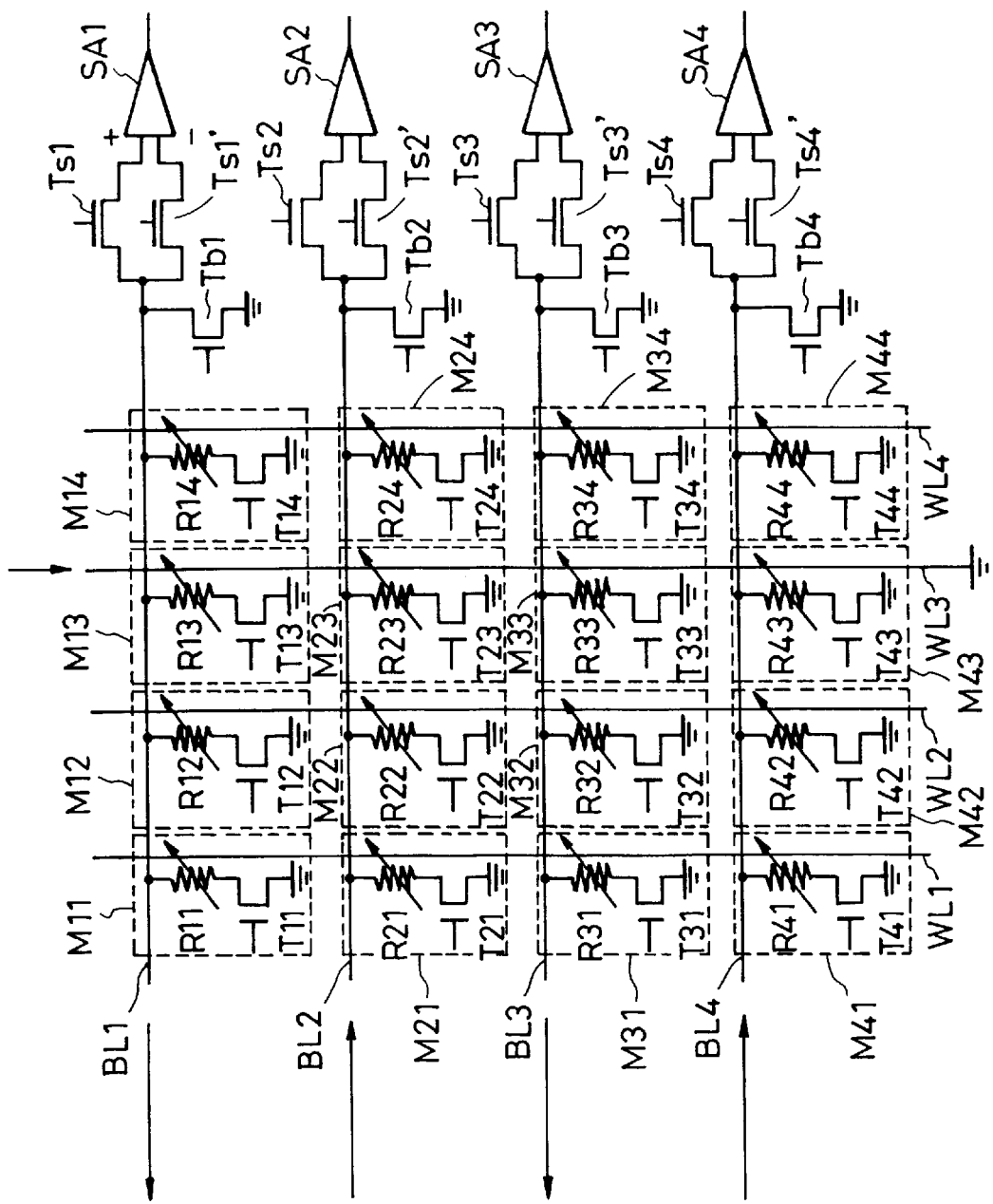
FIG. 26 is a drawing illustrating a method of driving an MRAM according to a fifth embodiment.

In the TMR element of this embodiment, a hard layer having high coercive force is used as a recording layer for recording information, and information is rewritten by changing the magnetization direction of the hard layer. A soft layer having lower coercive force than the hard layer functions as a free layer for switching the magnetization direction in reading out information. In this MRAM, an external electric pulse was applied to write information "0", "0", "0" and "0" in the four cells in one column, respectively. FIG. 26 is a drawing for explaining the operation of writing information.

As shown in FIG. 26, external pulse currents were respectively input to the bit lines BL1 to BL4 so that currents flowed in the directions of arrows, and the magnetic fields induced by the bit lines produced magnetization in the recording layers (hard layers: Co layers) of the TMR elements R13, R23, R33 and R43 in the rightward, leftward, rightward, and leftward, respectively, in FIG. 26, thereby writing information "0", "0", "1", "0" and "0", respectively. Namely, information "0" or "1" is written by changing the direction of the current passed through each of the bit lines, and the directions of the currents passed through the write lines are constant, and are used for applying an assist magnetic field. For example, the pulses may be applied as shown in FIG. 24.

Next, the operation of reading out the information written by the above-described operation was performed. FIGS. 27 to 30 are drawings illustrating the operation of reading out the written information.

Figure 27:
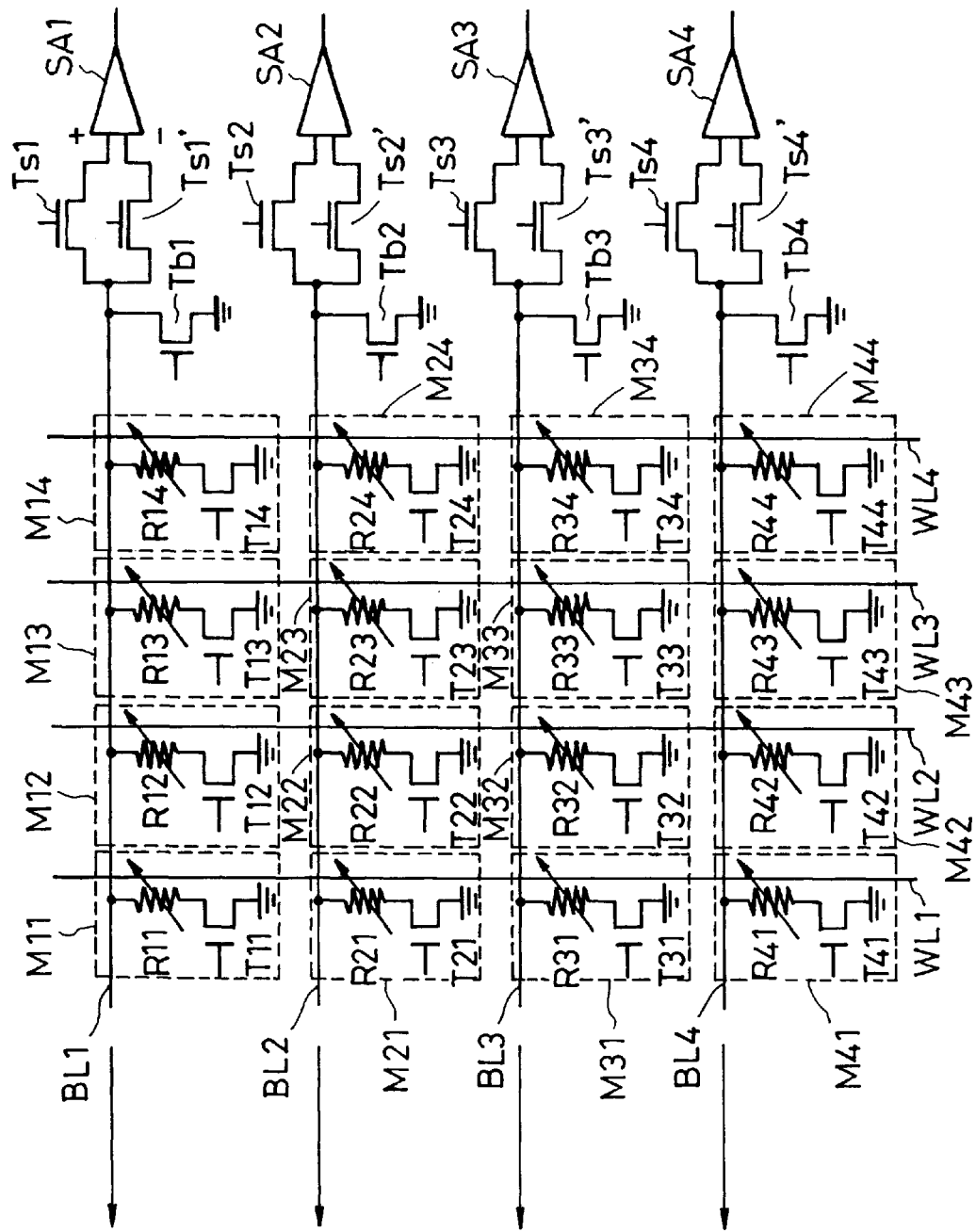
FIG. 27 is a drawing illustrating the operation of applying current pulses to memory elements to magnetize the elements in a direction during a readout operation in the fifth embodiment.

First, as shown in FIG. 27, a voltage of −3.3 V was applied to the bit lines so that currents flowed in the directions of arrows to produce rightward magnetization in the soft layers (NiFe layers) of the TMR elements R13, R23, R33 and R43. By this operation, each of the TMR elements R13 and R33 was put into the low-resistance state in which magnetizations of the soft layer and hard layer were parallel to each other, while each of the TMR elements R23 and R43 was put into the high-resistance state in which magnetizations of the soft layer and hard layer were antiparallel to each other.

Figure 28:
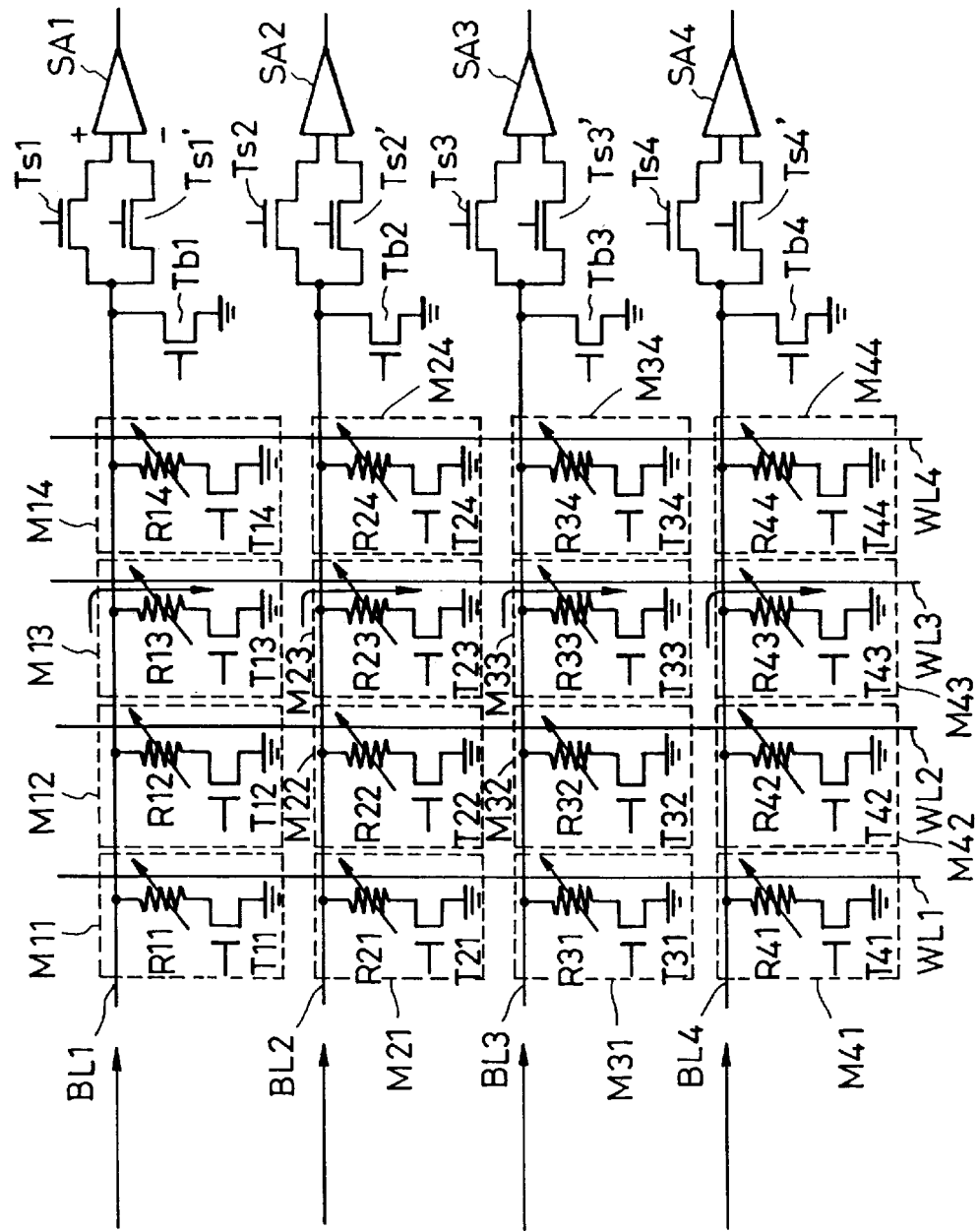
FIG. 28 is a drawing illustrating the operation of inputting the resistances of the magnetized memory elements shown in FIG. 27 to sense amplifiers.

Next, as shown in FIG. 28, the transistors T13, T23, T33 and T43 were turned on, and a constant current of about 10 $\mu$A was supplied to the bit lines to input the potentials of the bit lines to the + side terminals of the sense amplifiers SA1, SA2, SA3 and SA4, respectively, with the transistors Ts1, Ts2, Ts3 and Ts4 turned on.

Figure 29:
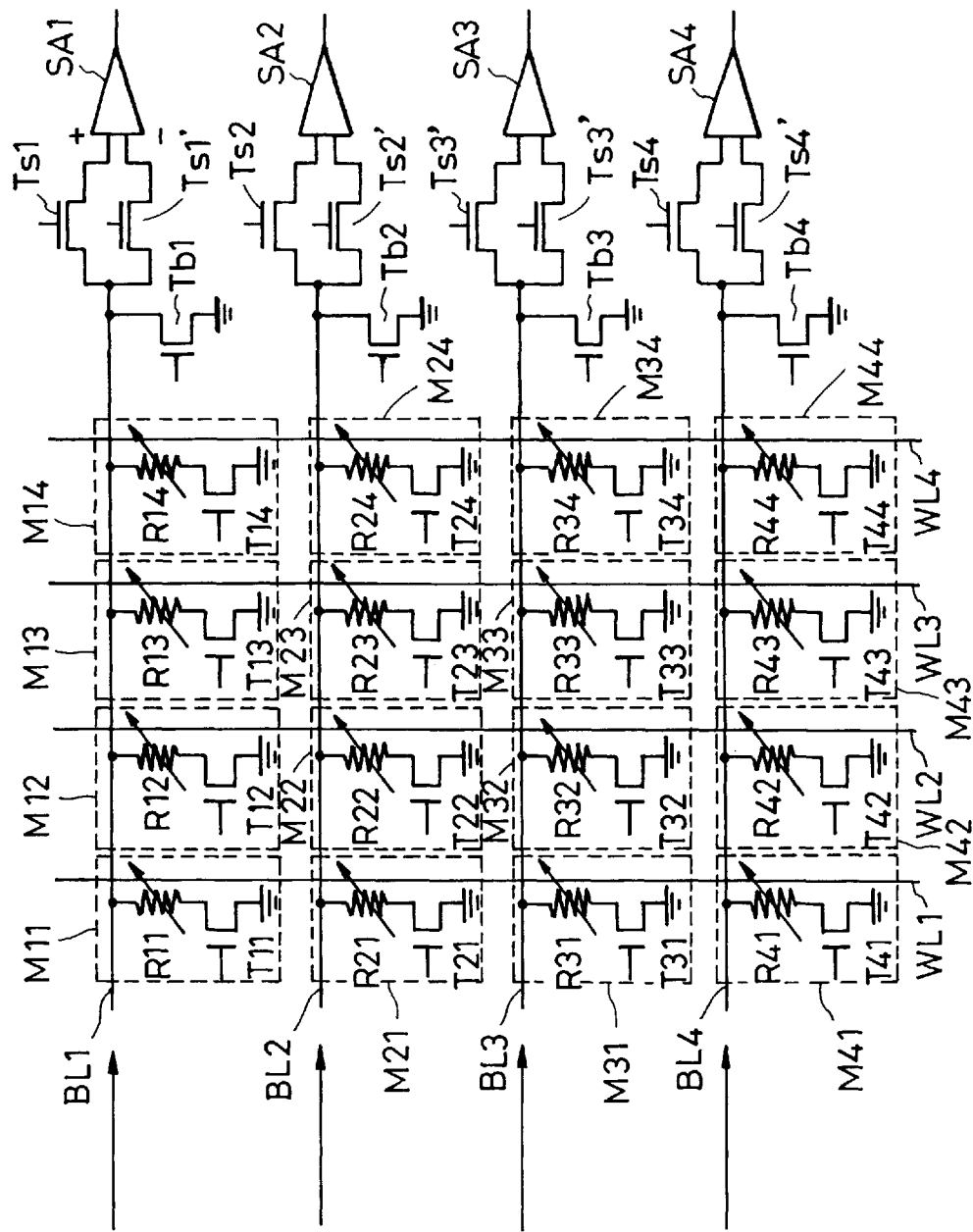
FIG. 29 is a drawing illustrating the operation of applying current pulses to memory elements to magnetize the elements in the direction reverse to FIG. 27 during a readout operation.

Next, as shown in FIG. 29, a voltage of 3.3 V was again applied to the bit lines so that currents flowed in the directions of arrows to produce leftward magnetization in the soft layers (NiFe layers) of the TMR elements R13, R23, R33 and R43. By this operation, each of the TMR elements R13 and R33 was put into the high-resistance state in which magnetizations of the soft layer and hard layer were antiparallel to each other, while each of the TMR elements R23 and R43 was put into the low-resistance state in which magnetizations of the soft layer and hard layer were parallel to each other.

Figure 30:
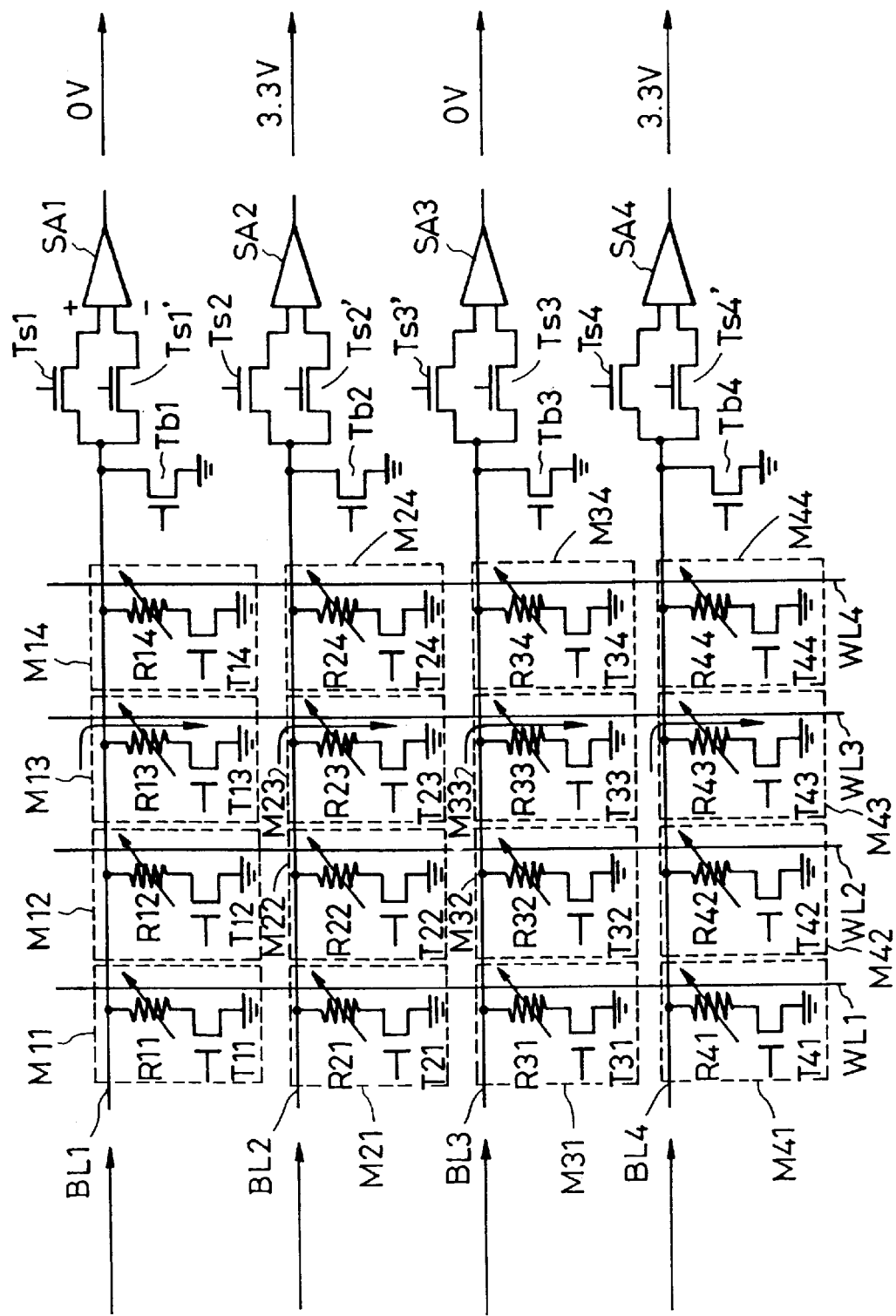
FIG. 30 is a drawing illustrating the operation of inputting the resistances of the magnetized memory elements shown in FIG. 29 to sense amplifiers.

Next, as shown in FIG. 30, the transistors T13, T23, T33 and T43 were turned on, and a constant current of about 10 $\mu$A was supplied to the bit lines to input the potentials of the bit lines to the side terminals of the sense amplifiers SA1, SA2, SA3 and SA4, respectively, with the transistors Ts1', Ts2', Ts3' and Ts4' turned on.

Figure 31:
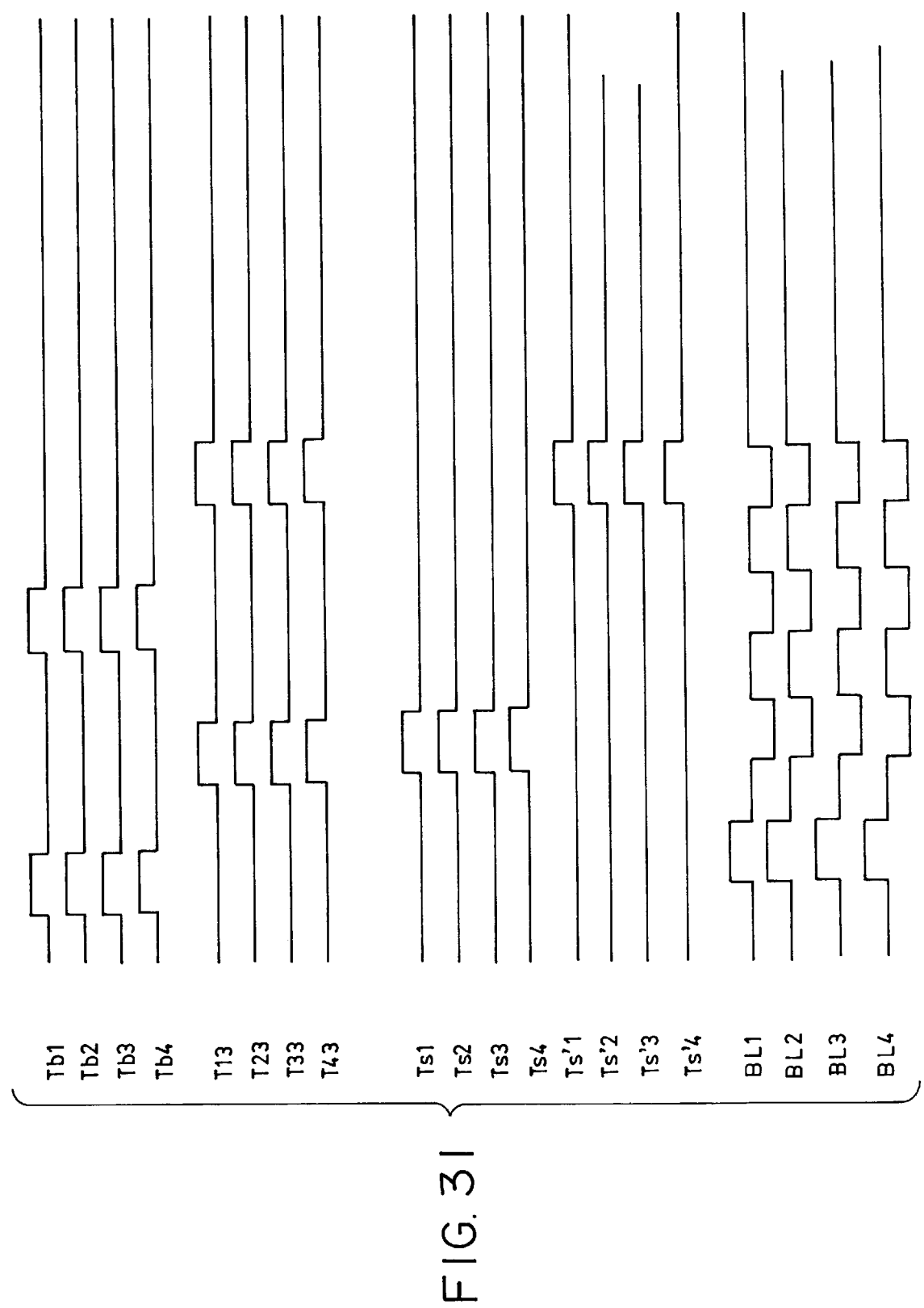
FIG. 31 is a time-sequence diagram showing the current pulses applied in the operations shown in FIGS. 26 to 30.

As a result, 0 V was output from the sense amplifiers SA1 and SA3, and a voltage of 3.3 V was output from the SA2 and SA4. This indicates that information of "0", "1", "0" and "1" are written in the TMR elements R13, R23, R33 and R43, respectively. FIG. 31 is a time-sequence diagram of the applied pulses.

Even when the hard layers are used as pinned layers, and the soft layers are used as recording layers, information can be read out without the write magnetic field applied in the direction of the easy magnetization axis. In this case, the sense amplifiers compare the potentials of the bit lines and the reference voltage to detect information.

In this embodiment, during both writing and reading, a current may be passed through each of the write line in a direction, thereby simplifying the function of a driver circuit connected to the write lines, and a power supply circuit. Namely, the driver circuit and power supply circuit have the function to supply a current in one direction. In this case, peripheral circuits can be miniaturized to permit the miniaturization of the whole apparatus. In this embodiment, the magnetic fields from the bit lines are applied in the direction of the easy magnetization axis of the memory elements to record information. In an in-plane magnetic film, when a memory element has a shape in which the length in the bit line direction is shorter than the length in the write line direction, the direction of the easy magnetization axis is easily made parallel to the write lines. Therefore, the MRAM having the driving method of this embodiment can be suitably used for a memory element having this shape.

Sixth Embodiment

Figure 32:
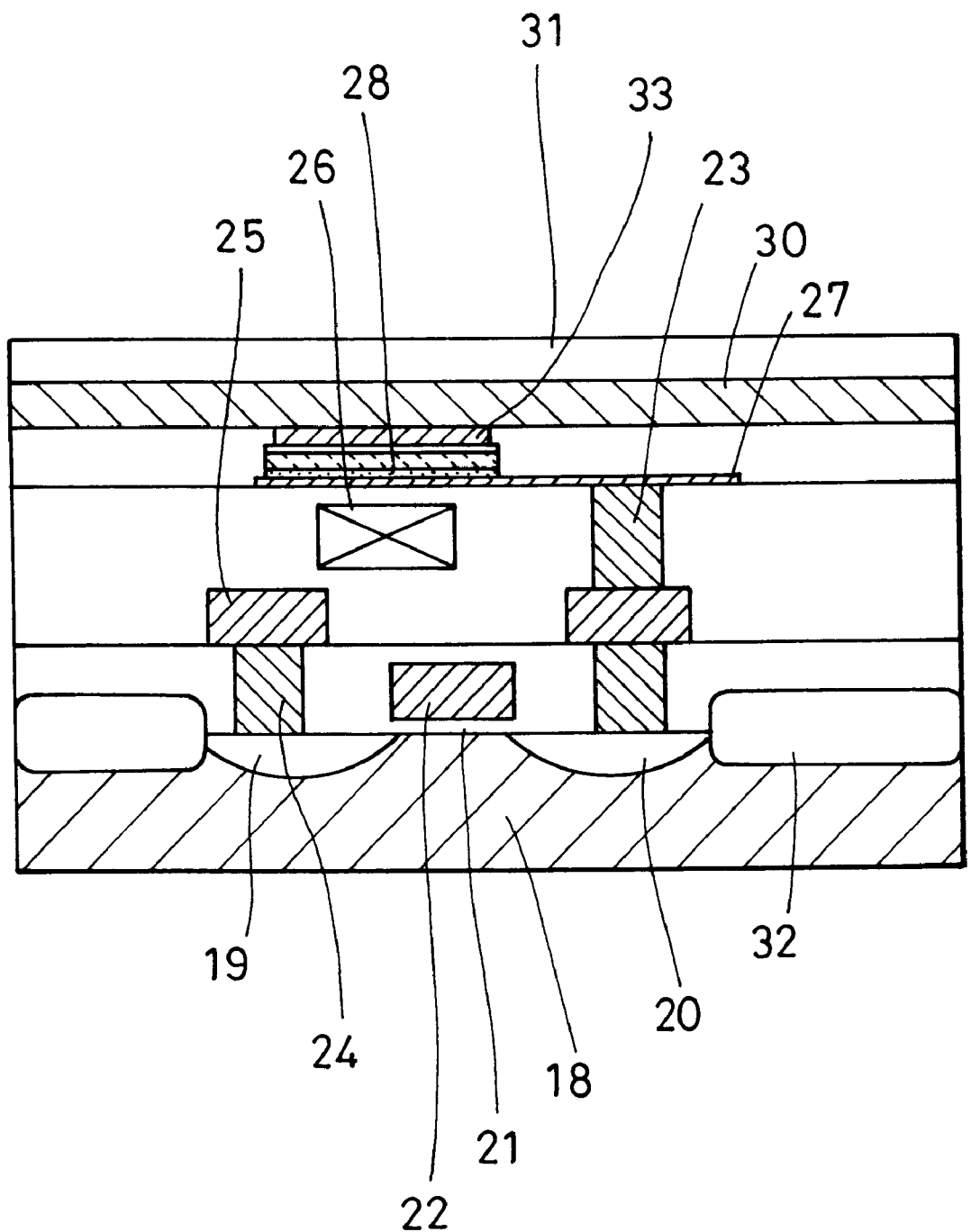
FIG. 32 is a schematic sectional view showing the sectional structure of a memory element according to a sixth embodiment.

FIG. 32 is a schematic sectional view showing the structure of a bit of MRAM of this embodiment.

In this embodiment, a perpendicular magnetization-type TMR element 33 comprising a GdFe/Al$_2$O$_3$/GdFe laminated film is used as a TMR element, and a bit line 30 is shifted from a position directly above the TMR element 33 so that a magnetic field induced from the bit line 30 is applied substantially perpendicularly to the TMR element 33. A write line is arranged directly below the TMR element to apply a magnetic filed in the planar direction of the element.

In this embodiment, as a result of the same operation experiment carried out in the same manner as the fourth embodiment, it was recognized that readout and write could be normally performed.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A magnetic random access memory comprising:
a plurality of memory elements arranged in a matrix so that the electric resistance of each of the memory elements can be switched to a high-resistance state and a low-resistance state by selecting the magnetization direction of a magnetic layer;
a plurality of bit lines arranged for the respective rows of the matrix; and
a plurality of write lines arranged for the respective columns of the matrix so as to cross the bit lines, ends of the memory elements being connected to any one of the bit lines;
wherein information is written in the memory elements arranged in a same row or column by performing once each of the first information writing step of applying a first magnetic field to put the memory elements in the high-resistance state, and the second information writing step of applying a second magnetic field to the memory elements in which the first information has not been written to write information in all memory elements in the same row under recording of information.

2. A magnetic random access memory according to claim 1, wherein in reading out information, information recorded on a plurality of the memory elements arranged in the same column is read out in parallel by applying pulses to a plurality of the bit lines.

3. A magnetic random access memory according to claim 1, wherein the magnetic layer is magnetized perpendicularly to the film plane.

4. A magnetic random access memory according to claim 3, wherein the first magnetic field and the second magnetic field are perpendicular to the film plane and produced by the current passed through each of the write lines, and the third magnetic field is horizontal relative to the film plane and produced by the current passed through each of the bit lines.

5. A magnetic random access memory according to claim 1, wherein the directions of the first magnetic field and the second magnetic field coincide with the direction of the easy magnetization axis of the magnetic layer.

6. A magnetic random access memory according to claim 5, wherein a third magnetic field in a direction different from the direction of the easy magnetization axis of the magnetic layer is applied at the same time at application of the first magnetic field and the second magnetic field.

7. A magnetic random access memory according to claim 6, wherein the third magnetic field is applied once to each of the memory elements arranged in a same column in which the first or second information is recorded.

8. A magnetic random access memory according to claim 6, wherein each of the memory elements is a tunnel magnetoresistance element having a structure in which an insulator is sandwiched between two magnetic layers.

9. A magnetic random access memory according to claim 6, wherein the first magnetic field and the second magnetic field are produced by passing a forward current and reverse current through the write lines, and the third magnetic field is produced by applying a current pulse to the bit line connected to the memory elements under writing of information.

10. A magnetic random access memory according to claim 9, wherein the pulses applied to the write lines and the bit lines are synchronous with each other.

11. A magnetic random access memory comprising:
a plurality of memory cells each comprising a magnetoresistive element as a memory element having a structure in which a nonmagnetic layer is sandwiched by magnetic layers;
a plurality of first wirings for applying a magnetic field in the direction of the easy magnetization axis of the magnetic layers; and
a plurality of second wirings for applying a magnetic field in a direction inclined from the direction of the easy magnetization axis of the magnetic layers, the memory cells being arranged in a matrix;
wherein a current is passed through one of the second wirings to apply a magnetic field to all memory elements arranged in a same row or column of rows or columns of a plurality of the memory cells arranged in parallel to the second wirings, and currents are passed through the plurality of first wirings in directions according to the information to be recorded in the respective memory elements synchronously with the current pulse passed through the second wiring to apply a magnetic field to each of the magnetoresistive elements, thereby recording information on the plurality of memory elements arranged in the same row or column.

12. A magnetic random access memory according to claim 11, wherein in reading out information, information recorded on a plurality of the memory elements arranged in the same column is read out in parallel by applying pulses to a plurality of the bit lines.

13. A magnetic random access memory according to claim 11, wherein each of the memory elements is a TMR element.

14. A magnetic random access memory according to claim 11, wherein each of the memory elements is a magnetoresistance element comprising a perpendicular magnetic film used as a magnetic film.

15. A magnetic random access memory according to claim 11, wherein the first wirings are used as bit lines for reading out information from the memory elements.

16. A magnetic random access memory according to claim 15, wherein a circuit is connected to the bit lines, for applying a current in two directions.

17. A magnetic random access memory comprising:
a plurality of memory elements arranged in a matrix so that the electric resistance of each of the memory elements are switched to a high-resistance state and a low-resistance state by selecting the magnetization direction of a magnetic layer;
a plurality of bit lines arranged for the respective rows of the matrix; and a plurality of write lines arranged for the respective columns of the matrix so as to cross the bit lines, the ends of the memory elements being connected to any one of the bit lines, wherein information is written in all memory elements for recording information which are arranged in the same row or column by performing once each of the first information writing step of applying a first magnetic field to the memory elements, and the second information writing step of applying a second magnetic field which is in a different direction than a direction of the first magnetic field, to the memory elements in which the first information has not been written.

18. A method of driving a magnetic random access memory comprising:

a first step of recording a first information by applying a first magnetic field to memory elements arranged in the same row or column; and a second step of recording a second information by applying a second magnetic field which is in a different direction than a direction of the first magnetic filed to the memory elements in which the first information has not been written, wherein information is written in all the memory elements for recording information which are arranged in the same row or column by said first step and said second step.

19. A magnetic random access memory comprising:

a plurality of memory elements arranged in a matrix so that the electric resistance of each of the memory elements can be switched to high-resistance state and a low resistance state by selecting the magnetization direction of a magnetic layer, a plurality of bit lines arranged for the respective rows of the matrix; and a plurality of write lines arranged for the respective columns of the matrix so as to cross the bit lines, the ends of the memory elements being connected to any one of the bit lines, wherein information is written in the memory elements arranged in the same row or column by performing once each of the first information writing step of applying a first magnetic field to put the memory elements in the high resistance state, and the second information writing step of applying a second magnetic field to the memory elements in which the first information has not been written to write information in all memory elements in the same row or column for recording information.

* * * * *

UNITED STATES PATENT AND TRADEMARK OFFICE
CERTIFICATE OF CORRECTION

PATENT NO. : 6,724,651 B2
DATED : April 20, 2004
INVENTOR(S) : Hirari

Page 1 of 1

It is certified that error appears in the above-identified patent and that said Letters Patent is hereby corrected as shown below:

Title page,
Item [56], References Cited, OTHER PUBLICATIONS, "R.E. Scheuerlein," reference, "Non-Valatile" should read -- Non-Volatile --.

Column 4,
Line 54, "easy magnetization easy axis" should read -- easy magnetization axis --; and
Line 56, "easy." should read -- axis. --.

Column 8,
Line 7, "reference" should read -- reference to --.

Column 9,
Line 12, "the each of" should read -- each of the --;
Line 33, "plan." should read -- plane. --; and
Line 58, "via" should read -- a via --.

Column 11,
Line 2, "the-side" should read -- the side --;
Line 6, "show" should read -- shown --;
Lines 11 and 43, ""0", "0" and "0"" should read -- "1", "0" and "1" --.

Signed and Sealed this

Twenty-seventh Day of September, 2005

JON W. DUDAS
*Director of the United States Patent and Trademark Office*